(12) United States Patent
Guo et al.

(10) Patent No.: US 11,862,260 B2
(45) Date of Patent: Jan. 2, 2024

(54) AUDIT TECHNIQUES FOR READ DISTURB DETECTION IN AN OPEN MEMORY BLOCK

(71) Applicant: SanDisk Technologies LLC, Addison, TX (US)

(72) Inventors: Jiacen Guo, Sunnyvale, CA (US); Swaroop Kaza, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 138 days.

(21) Appl. No.: 17/671,015

(22) Filed: Feb. 14, 2022

(65) Prior Publication Data

US 2023/0260584 A1     Aug. 17, 2023

(51) Int. Cl.
| | |
|---|---|
| *G11C 16/34* | (2006.01) |
| *G11C 16/04* | (2006.01) |
| *G11C 16/08* | (2006.01) |
| *G11C 16/16* | (2006.01) |
| *H10B 43/27* | (2023.01) |

(52) U.S. Cl.
CPC ........ *G11C 16/349* (2013.01); *G11C 16/0483* (2013.01); *G11C 16/08* (2013.01); *G11C 16/16* (2013.01); *G11C 16/3422* (2013.01); *H10B 43/27* (2023.02)

(58) Field of Classification Search
CPC .................................................. G11C 16/349
See application file for complete search history.

(56) References Cited

U.S. PATENT DOCUMENTS

2021/0295941 A1 *  9/2021  Asami ................... G11C 16/10

* cited by examiner

*Primary Examiner* — Jason Lappas
(74) *Attorney, Agent, or Firm* — Hector A. Agdeppa; SHEPPARD MULLIN RICHTER & HAMPTON LLP

(57) ABSTRACT

Read disturb audit techniques that include algorithmically applying audit verify voltages to erased wordlines in an open memory block are described. In an audit verify technique, a pass-through voltage ensured to be higher than any threshold voltage of any cell is applied to each wordline in an open memory block that includes one or more programmed memory cells, and an audit verify voltage lower than the pass-through voltage is applied to each erased wordline. A first bit count representing a number of non-conductive bitline(s) is determined and compared to a threshold value to determine whether to continue or discontinue block operation. In an audit verify and audit gap technique, the erased wordlines are divided into disjoint first and second groups, and an audit verify voltage and a non-verify voltage are alternatively applied to the groups in different audit verify stages.

20 Claims, 17 Drawing Sheets

AUDIT TECHNIQUES FOR READ DISTURB DETECTION IN AN OPEN MEMORY BLOCK

BACKGROUND

Flash memory is an electronic, non-volatile computer memory storage medium that can be electrically erased and reprogrammed. Flash memory is widely used across a range of products and industries including computers, mobile phones, tablet devices, personal digital assistants (PDAs), digital audio players, digital cameras, video games, scientific instrumentation, industrial robotics, and medical electronics, to name a few. NAND flash memory—one of the two primary types of flash memory—can be found in memory cards, USB flash drives, solid-state drives, smartphones, and the like. NAND flash may employ floating gate transistors, such as floating gate metal-oxide-semiconductor field-effect transistors (MOSFETs), connected in a manner that resembles a NAND logic gate.

NAND flash memory reliability degrades as the memory is scaled down and more bits are programmed per cell. A contributor to this reduced reliability is a phenomenon known as read disturb. Read disturb occurs when a read to one row of flash cells impacts the threshold voltages of unread cells in different rows of the same block. These disturbances may shift the threshold voltages of the unread cells—in particular those cells in an erased state—to different logical states, which can result in read errors.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
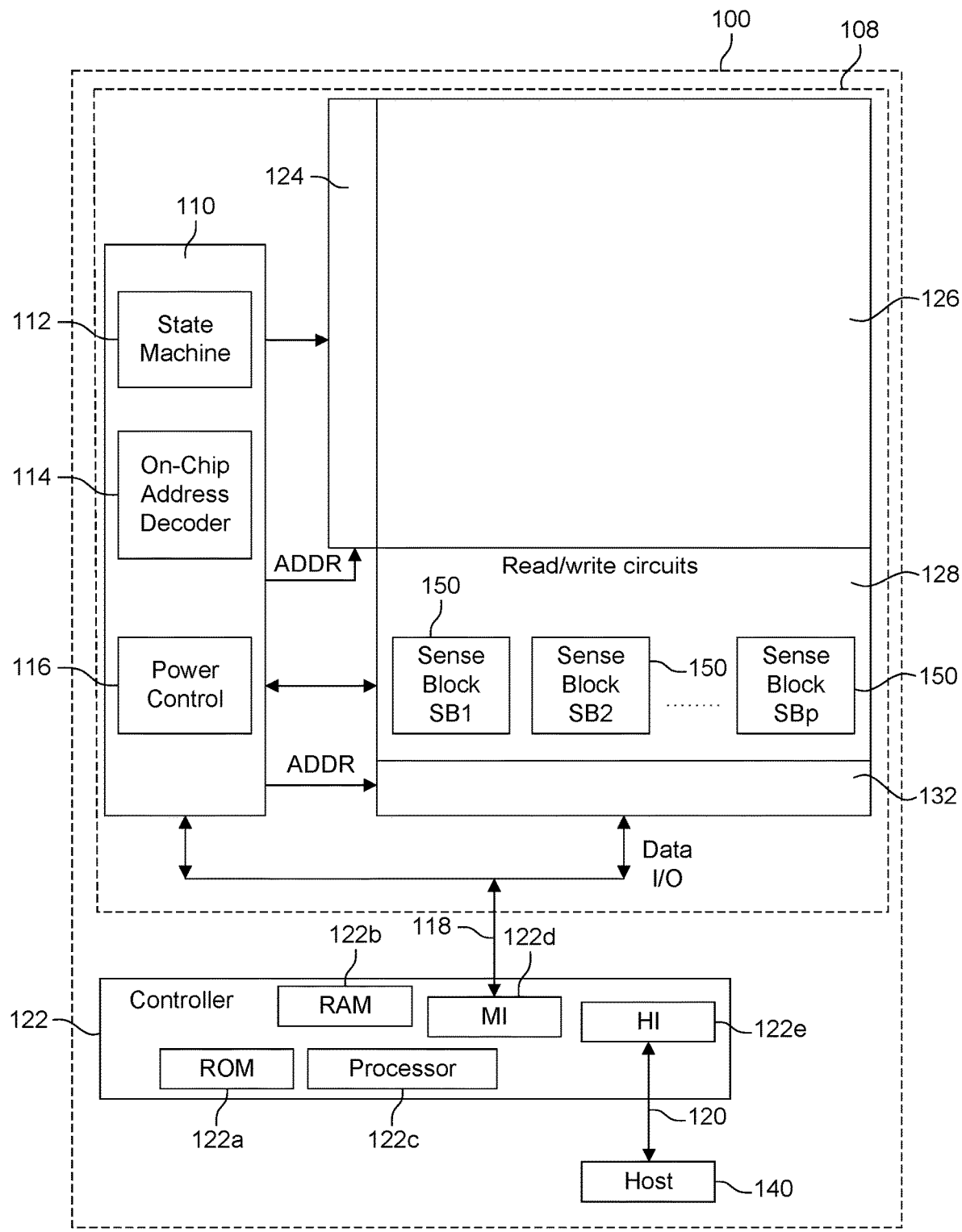
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Due to its increasing data storage capacity, NAND flash memory is now used in a wide range of systems from mobile devices and client computers to data center storage. This capacity increase has been largely driven by the scaling down of transistors combined with the introduction of multi-level cell (MLC) technology, according to which a single flash cell can store more than one bit of data. While transistor scaling and MLC technology have led to large increases in NAND flash capacity, these capacity increases have come at the cost of increased circuit-level noise, with the frequency of errors relating to read disturb noise, in particular, experiencing a substantial uptick. This increased tendency towards read disturb induced errors is further exacerbated by the uneven distribution of reads across flash blocks in contemporary workloads, where certain flash blocks may experience high temporal locality, and thus, may more rapidly exceed the read count at which read disturb errors are induced.

Read disturb induced errors are a result of the NAND flash architecture and the method used to perform a read operation on NAND flash. In particular, flash memories, including NAND flash memories, store data in memory cells comprised of charge trapping layer (CTL) transistors or floating gate (FG) transistors. These types of MOSFETs differ from a regular MOSFET in that they include an electrically insulated gate between the control gate and the channel. As a result of this electrical isolation, any electron reaching this gate will become trapped there even after an applied voltage is removed. This gives flash memory its non-volatile property. Unlike a regular MOSFET, however, which has a fixed threshold voltage, the threshold voltage of a CTL or FG MOSFET depends on the amount of charge stored in the gate (i.e., the more charge that is stored, the higher the threshold voltage). Thus, data can be stored in a flash cell as the threshold voltage of the cell, based on the logical value that the threshold voltage represents. Similar to a regular MOSFET, when an applied gate-source voltage is more than the threshold voltage, the CTL or FG MOSFET will start conducting. The information stored in a CTL or FG MOSFET is thus identified by using a fixed voltage level to check whether the target cell is conductive or not, which corresponds to a read operation in flash memory. A CTL MOSFET flash memory implementation differs from an FG MOSFET implementation at least with respect to a contiguous dielectric such as silicon nitride being used in the CTL MOSFET in place of the highly conductive dis-contiguous metal layers used to form the floating gates in an FG MOSFET implementation. While example embodiments may be described hereinafter using the CTL MOSFET as an example implementation of a flash memory cell, it should be appreciated that such embodiments are also applicable to FG MOSFETs or other flash memory technology.

More specifically, during a read operation to a flash cell, a read reference voltage is applied to the transistor corresponding to the cell. For example, in the case of single-level cell (SLC) flash memory in which each cell stores one bit of information (i.e., a logic 1 or a logic 0), if the read reference voltage applied to a transistor of the cell is higher than the threshold voltage of the cell, the transistor is turned ON, and it is determined that the cell stores a logic 1. If the read reference voltage is not sufficient to turn the transistor ON (i.e., the threshold voltage is higher than the read reference voltage), then it is determined that the cell stores a logic 0.

In example embodiments, a read operation may be performed on a per-string basis, while an erase operation may be performed on a per-block basis. More specifically, in some embodiments, a NAND flash memory block, for example, may include multiple NAND strings. In the case of a 3D NAND architecture, each NAND string may include potentially several thousand memory holes, where each memory hole includes a collection of wordlines that are shared among all memory holes/strings/blocks of the 3D NAND structure. That portion of a wordline corresponding to a given memory hole may constitute a single flash cell within the NAND structure. A number of bitlines may be provided that is equal to a number of memory holes in a given NAND string. Each bitline may connect a respective memory hole from each NAND string across all strings/blocks of the NAND structure.

As noted earlier, in some embodiments, a read operation is performed with respect to a selected NAND string. Further, in some embodiments, one flash cell may be read at a time per bitline. In order to read a given cell (i.e., determine whether an applied voltage to the cell switches the transistor ON), the transistors for the cells not being read are kept ON to allow the value from the cell being read to propagate to the output. This is achieved by applying a pass-through voltage to each cell not being read that is higher than any threshold voltage of any of the transistors of the cells not being read. Although these other cells are not being read, the high pass-through voltage to their transistors may induce an electric tunneling effect that can shift the threshold voltages of these unread cells to higher values corresponding to different logical states, which in turn, can disturb the cell contents. This is referred to as read disturb. Erased cells may be particularly impacted by read disturb. Moreover, as the size of flash cells is scaled down further, the transistor oxide layer becomes thinner, which further increases this tunneling effect. With each read operation thus having an increased tunneling effect, read disturb errors may be induced after fewer read operations.

Flash memory cells are connected in a hierarchy that allows for efficient data access. Referring to an example 3D NAND flash architecture in more detail, a 3D NAND structure may include two distinct planes, each of which includes multiple vertically stacked layers that constitute the wordlines of the 3D NAND structure. Each plane may include 112 wordlines in an example implementation. Each plane may include multiple NAND blocks that extend both horizontally across the plane as well as vertically through the wordline layers. Each NAND block may be comprised of four NAND strings, in an example implementation. Each NAND string, in turn, may include 16K memory holes, which may be referred to collectively as a page. Each memory hole may extend vertically through the wordline layers of the 3D NAND structure, with each memory hole/wordline intersection representing a single cell of the NAND structure.

In some embodiments, a respective bitline may be provided for each memory hole such that a given bitline connects a respective corresponding memory hole from each NAND string of each NAND block of the 3D NAND structure. More specifically, within a given NAND block, each NAND string may include, for example, 16K memory holes. In some embodiments, the memory holes of a given NAND string may be arranged in rows (e.g., 4 rows) that are offset with respect to one another. As such, in some embodiments, each bitline may connect a respective memory hole from each NAND string and may extend across all NAND blocks, where each respective memory hole connected to the same bitline occupies a same relative position within the arrangement of memory holes of a corresponding NAND string. Thus, assuming 16K memory holes in each NAND string, 16K bitlines may be provided, where each bitline connects a respective memory hole from each NAND string. As previously noted, in the case of NAND flash, a NAND string, which may include 16K memory holes in an example implementation, is the minimum unit for read and programming operations, whereas a block (e.g., including 4 NAND strings) is the smallest unit for erase operations.

To program a flash memory cell, a high voltage is applied to the wordline that includes the cell to be programmed. In particular, a programming voltage $V_{PGM}$ is applied to the control gate of the transistor of the cell sought to be programmed. The applied voltage is coupled to the CTL through the dielectric, which raises the CTL to $V_{PGM}$, and ultimately results in electrons breaking the oxide barrier and accumulating on the CTL. Stated another way, application of $V_{PGM}$ to the control gate generates a high electric field—with a strong negative charge on the transistor's source and drain and a strong positive charge on the control gate—that causes the electrons to migrate from the channel to the CTL. This increases the threshold voltage of the transistor of the cell and corresponds to storing a logic 0 state in the cell. In contrast, a flash memory cell is erased by applying an erase voltage $V_{ERA}$ to a source or drain of the transistor to generate an electric field—with a strong positive charge on the cell's source and drain and a strong negative charge on the control gate—which induces a tunneling effect, referred to as Fowler-Nordheim tunneling, whereby electrons migrate from the CTL to the channel. This lowers the threshold voltage of the transistor of the cell and corresponds to a logic 1 state for the cell.

As previously described, a read operation is performed in flash memory by applying a read reference voltage to the wordline containing the cell sought to be read and a pass-through voltage to all other wordlines, where the pass-through voltage is ensured to be larger than the threshold voltages of the transistors of these unread cells. While this pass-through voltage is large enough to exceed the threshold voltages of the transistors of the unread cells, it is generally not as large as the programming voltage $V_{PGM}$ used to program flash cells. In some implementations, a flash memory cell such as an triple-level cell (TLC) flash cell may be in any of multiple different states (e.g., states A through G), with each state representing a different bit sequence and logical state and corresponding to a different number of trapped electrons in the CTL, and thus, a different threshold voltage. For example, an A state may correspond to a lowest threshold voltage among states A to G, and the G state may correspond to the highest threshold voltage among the states. Thus, in some implementations, the pass-through voltage may need to be higher than the G state threshold voltage to ensure that the transistor of each unread cell is switched ON.

As previously described, repeated application of the pass-through voltage to unread cells in connection with multiple read operations can, after some threshold number of reads are performed, induce a read disturb effect, whereby electrons may begin to migrate from the channel into the CTL, thereby altering the threshold voltages of unread cells, and potentially changing the logic states of these cells. This is referred to as "soft-programming" of the unread cells. This read disturb effect may be more pronounced for open flash memory blocks that contain empty wordlines wordlines that include constituent cells in the erased state) than for closed memory blocks in which each wordline has been written to, with the effect becoming increasingly more pronounced as the number of erased wordlines increases. For example, application of the pass-through voltage may have the most pronounced effect on a cell that is in an erased state (corresponding to a threshold voltage lower than a threshold voltage associated with any programmable state) because the difference between the pass-through voltage and the threshold voltage of such a cell is greatest.

Because the read disturb effect can be particularly pronounced for open memory blocks, it is desirable to assess the read disturb level of an open memory block to determine if the read disturb experienced by erased wordlines, for example, was severe enough to shift the threshold voltages of cells in these wordlines to different logical states. If so, operation of the block may be discontinued and the block may be refreshed by an erase operation. Because reading every wordline to identify the one experiencing the worse read disturb is time-consuming and inefficient, an existing approach for read disturb detection performs a read of an erase upper tail of only a first wordline of a block. Upon reading the erase upper tail of the first wordline, this existing approach may compare the erase upper tail to a cycle trigger level for the first wordline to determine whether the block should be cycled (i.e., erased). The cycle trigger level may be a specified threshold voltage that represents an upper threshold voltage bound for cells in the erased state.

Even though multiple cells may be in the same logical state (e.g., the erased state), their transistors may nonetheless exhibit some variation in their threshold voltages due to variation during the fabrication process or the like. Thus, the threshold voltages of all cells in the erased state, for example, may exhibit a normal distribution. Similarly, cells in the first wordline may also have a normal distribution of threshold voltages. Further, although the first wordline in an open memory block is typically filled with some data (i.e., a logic 0 is stored by at least some cells in the first wordline), there may also be at least some cells in the first wordline that are in the erased state. As such, while an upper tail may refer generally to an upper end of a normal distribution of threshold voltages, an erase upper tail of the first wordline may refer to the upper tail end of the distribution of threshold voltages for those cells in the erased state in the first wordline.

The above-described existing read disturb detection approach suffers from a number of technical problems. In particular, the approach only reads the first wordline to make an assessment of the read disturb level for the entire memory block, but the first wordline may not have the worst read disturb impact in the block, and moreover, the first wordline includes at least some cells filled with data, and thus, is likely to experience less read disturb than wordlines in which all cells are in the erased state. As such, it becomes difficult to select a cycle trigger level, and even after assigning a level, the assigned level is generally not consistent from block to block. Thus, the first wordline is an unreliable indicator of the actual read disturb level of an open memory block, and in fact, the first wordline can experience a read disturb induced impact that is substantially less than that exhibited by an erased wordline experiencing the worst read disturb in the block. In addition, in those scenarios in which the first wordline is the only wordline with data in an open memory block (i.e., all other wordlines are erased wordlines), then the first wordline will likely experience almost no read disturb impact because it has never received a pass-through voltage, potentially making it a completely unreliable indicator of the level of read disturb in the block. Yet another technical problem of this existing approach is that it is unable to detect a read disturb issue impacting, for example, a single erased wordline.

Embodiments of the disclosed technology solve the aforementioned technical problems by providing read disturb audit techniques that yield a more accurate assessment of the read disturb level of an open memory block. In particular, audit techniques according to embodiments of the disclosed technology include algorithmically applying audit verify voltages to erased wordlines in an open memory block to more accurately determine whether the erased wordlines are experiencing severe read disturb. As a result, the audit techniques disclosed herein provide a technical improvement over the aforementioned existing read disturb detection approach, which relies solely on the first wordline of an open memory block to make an assessment of the read disturb level of the entire block (including erased wordlines of the block) even though, as previously noted, the first wordline can be a notoriously unreliable indicator of the level of read disturb impacting the block, and in particular, the erased wordlines of the block. Audit techniques according to embodiments of the disclosed technology also provide a number of other technical benefits over the above-described existing read disturb detection approach including, without limitation, the capability to detect single wordline read disturb issues; the capability to cover all open memory block cases including those in which only the first wordline is programmed (i.e., all other wordlines are erased); an increased tolerance for die-to-die and cycle-to-cycle variance among different memory blocks; and an increase in the lifetime of an open memory block, which results in power savings. Moreover, the audit techniques disclosed herein achieve all of the above-mentioned technical solutions/benefits/improvements over the existing read disturb detection approach without increasing the time required to perform the read disturb audit.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes state machine 112, an on-chip address decoder 114, and a power control circuit 116. In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122 *c*, ROM 122 *a*, RAM 122 *b*, a memory interface (MI) 122 *d* and a host interface (HI) 122 *e*, all of which are interconnected. The storage devices (ROM 122 *a*, RAM 122 *b*) store code (software) such as a set of instructions (including firmware), and one or more processors 122 *c* is/are operable to execute the set of instructions to provide the functionality described herein. Alternatively or additionally, one or more processors 122 *c* can access code from a storage device in the memory structure, such as a reserved area of memory cells connected to one or more wordlines. RAM 122 *b* can be to store data for controller 122, including caching program data (discussed below). Memory interface 122 *d*, in communication with ROM 122 *a*, RAM 122 *b* and processor 122 *c*, is an electrical circuit that provides an electrical interface between controller 122 and one or more memory die 108. For example, memory interface 122 *d* can change the format or timing of signals, provide a buffer, isolate from surges, latch I/O, etc. One or more processors 122 *c* can issue commands to control circuitry 110 (or another component of memory die 108) via Memory Interface 122 *d*. Host interface 122 *e* provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bitline arrays, and the like.

One example of a ReRAM, or PCMRAM, cross point memory includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
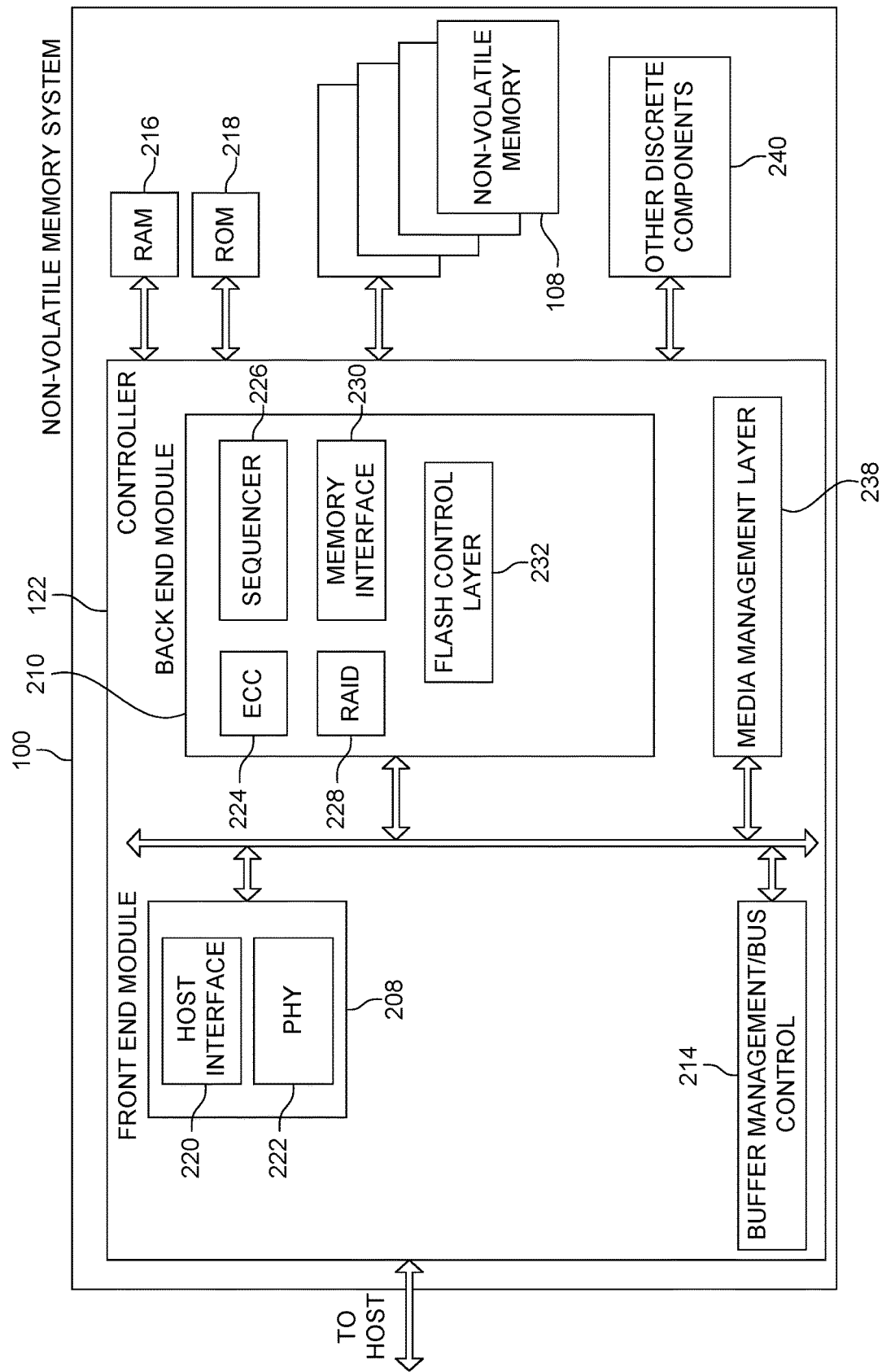
FIG. 2 is a block diagram of an example memory system, in connection with which, example embodiments of the disclosed technology can be implemented.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes to the memory 126.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
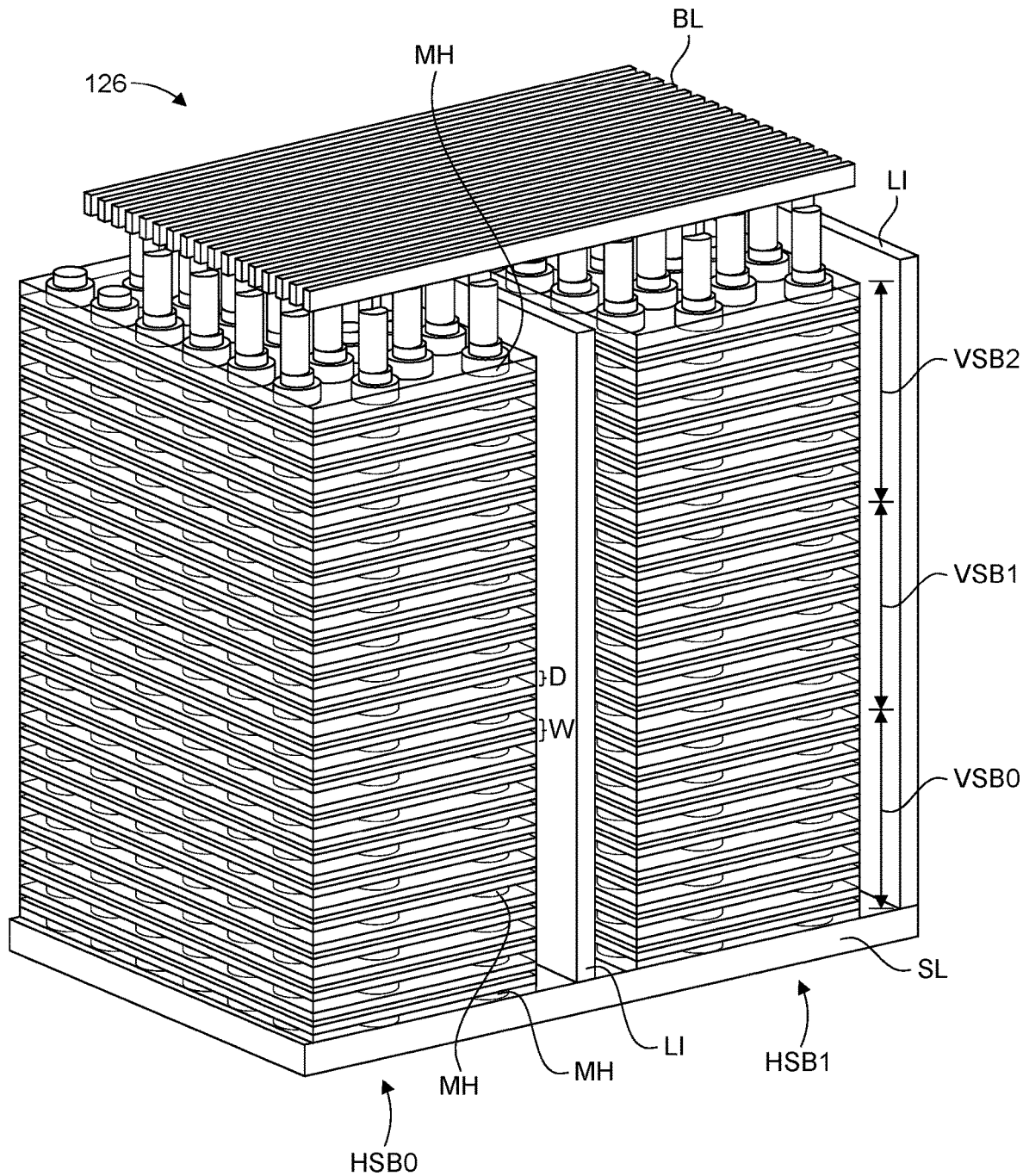
FIG. 3 is a perspective view of a portion of an example monolithic three-dimensional memory structure, in connection with which, example embodiments of the disclosed technology can be implemented.

FIG. 3 is a perspective view of a portion of one example embodiment of a monolithic three dimensional memory array that can comprise memory structure 126, which includes a plurality non-volatile memory cells. For example, FIG. 3 shows a portion of one block of memory. The structure depicted includes a set of bitlines BL positioned above a stack of alternating dielectric layers and conductive layers. For example purposes, one of the dielectric layers is marked as D and one of the conductive layers (also called wordline layers) is marked as W. The number of alternating dielectric layers and conductive layers can vary based on specific implementation requirements. One set of embodiments includes between 108-300 alternating dielectric layers and conductive layers. One example embodiment includes 96 data wordline layers, 8 select layers, 6 dummy wordline layers and 110 dielectric layers. More or less than 108-300 layers can also be used. Data wordline layers have data memory cells. Dummy wordline layers have dummy memory cells. As will be explained below, the alternating dielectric layers and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 presents challenges due to the valid data in the other vertical sub-blocks VSB0, VSB2.

Figure 4A:
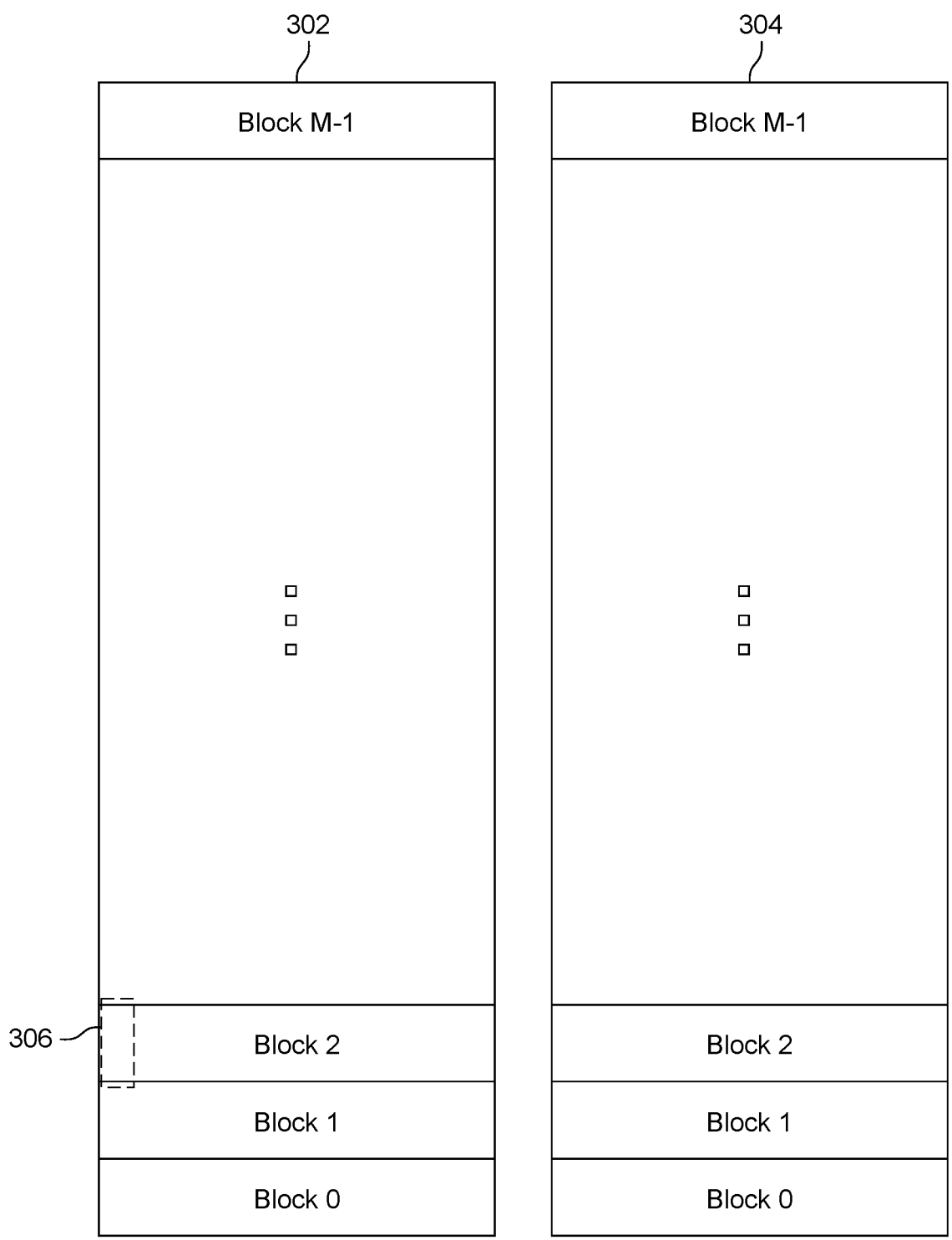
FIG. 4A is a block diagram of an example memory structure having two planes, in connection with which, example embodiments of the disclosed technology can be implemented.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of wordlines.

Figure 4B:
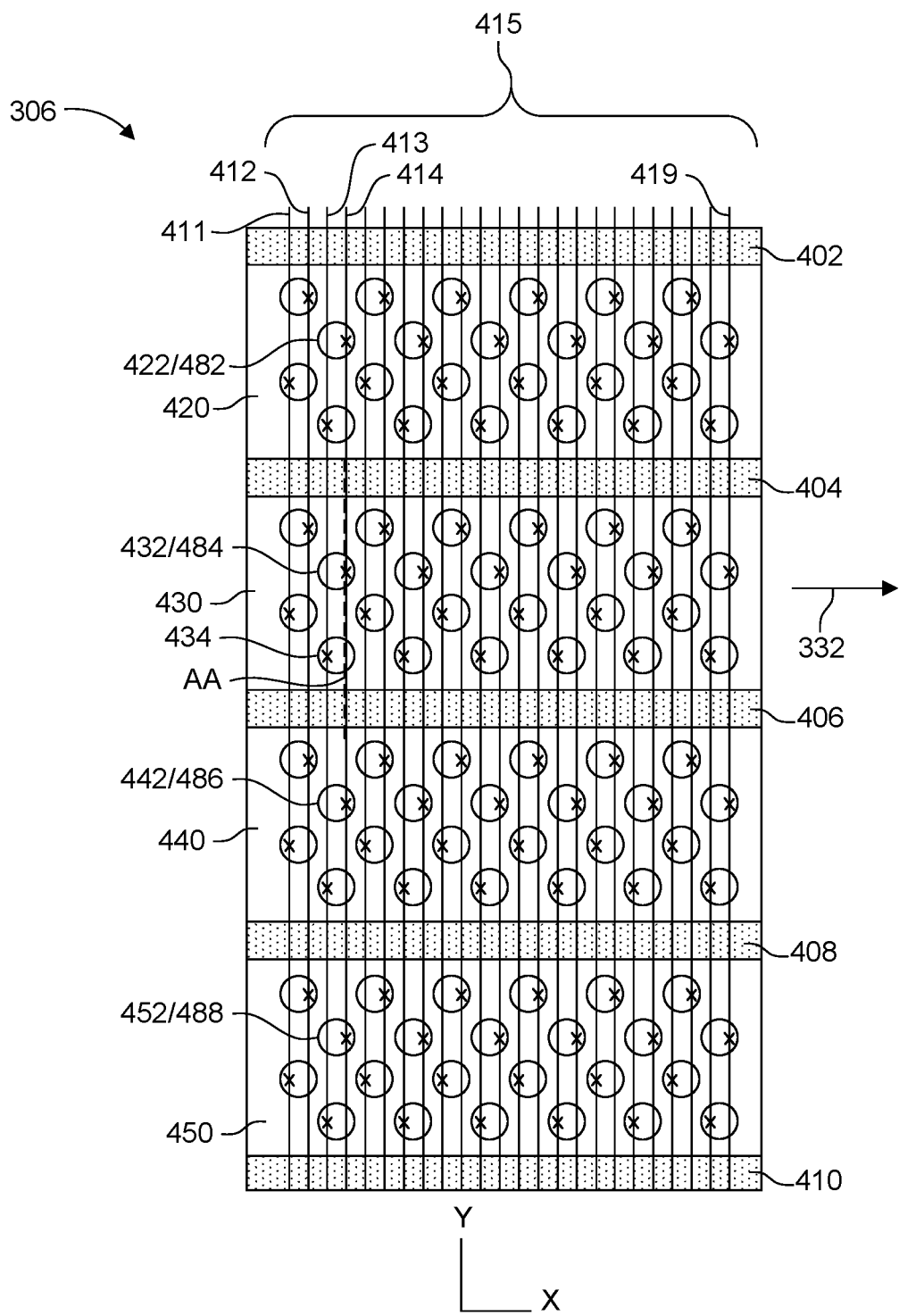
FIG. 4B depicts a top view of a portion of a block of example memory cells, in connection with which, example embodiments of the disclosed technology can be implemented.

FIGS. 4B-4F depict an example three dimensional ("3D") NAND structure that corresponds to the structure of FIG. 3 and can be used to implement memory structure 126 of FIG. 2. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of four rows connected to a common bitline are connected to the same wordline (via different wordline fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
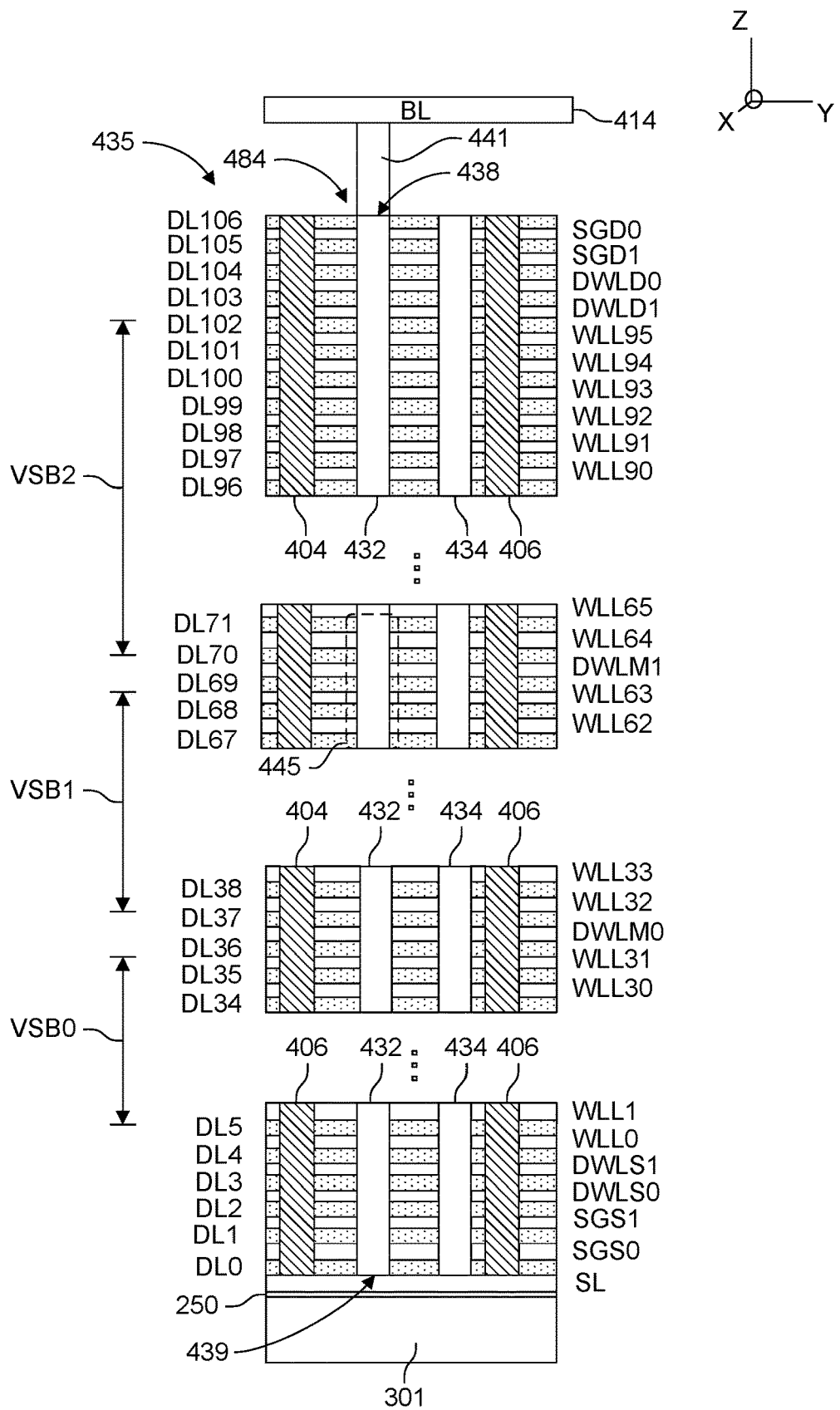
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding with vertical sub-block VSB0 wordlines WLL0-WLL31) from a second set of memory cell transistors within the memory string (e.g., corresponding with the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy wordline layers DWLM in order to divide the stack 435 into the additional vertical sub-blocks. In one embodiment, the stack has two vertical sub-blocks.

Figure 4D:
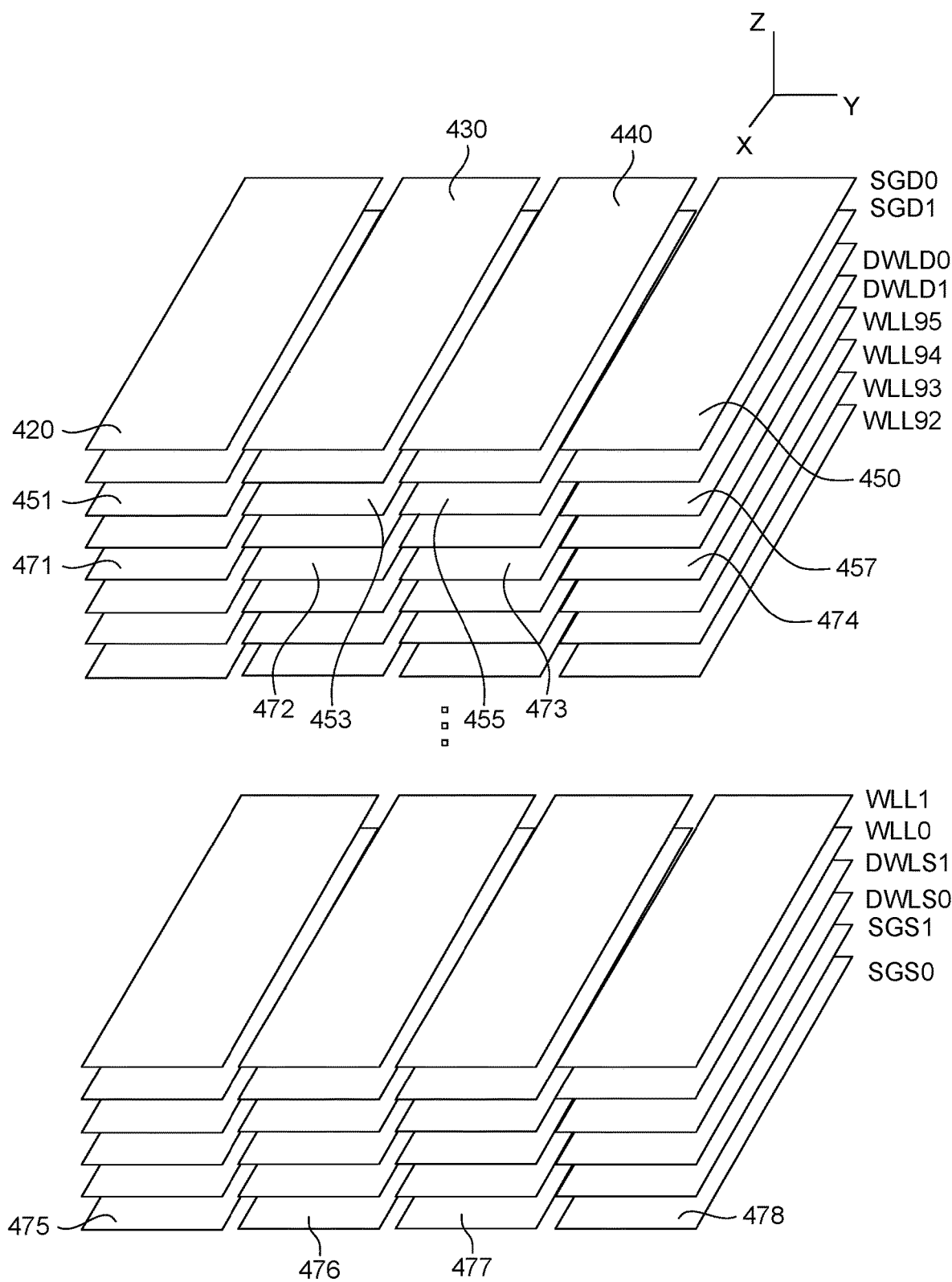
FIG. 4D depicts an alternative view of the select gate layers and wordline layers of the stack 435 of FIG. 4C.

FIG. 4D depicts an alternative view of the SG layers and wordline layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy wordline layers. Each dummy wordline layer represents a wordline, in one approach, and is connected to a set of dummy memory cells at a given height in the stack. For example, DWLD0 comprises wordline layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474.

Below the data wordline layers are the source-side dummy wordline layers.

Below the source-side dummy wordline layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or, the SG lines can be connected and commonly controlled.

Figure 4E:
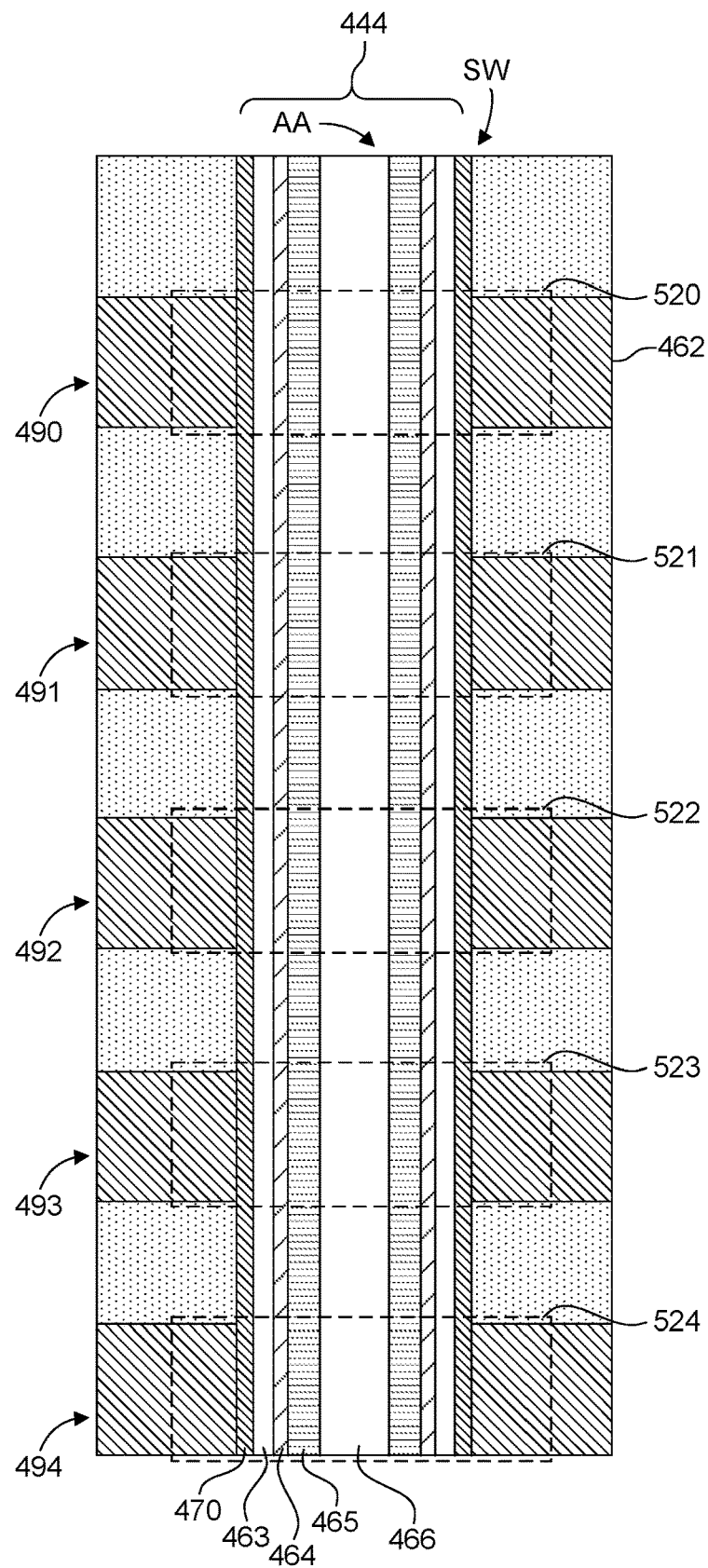
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Figure 4F:
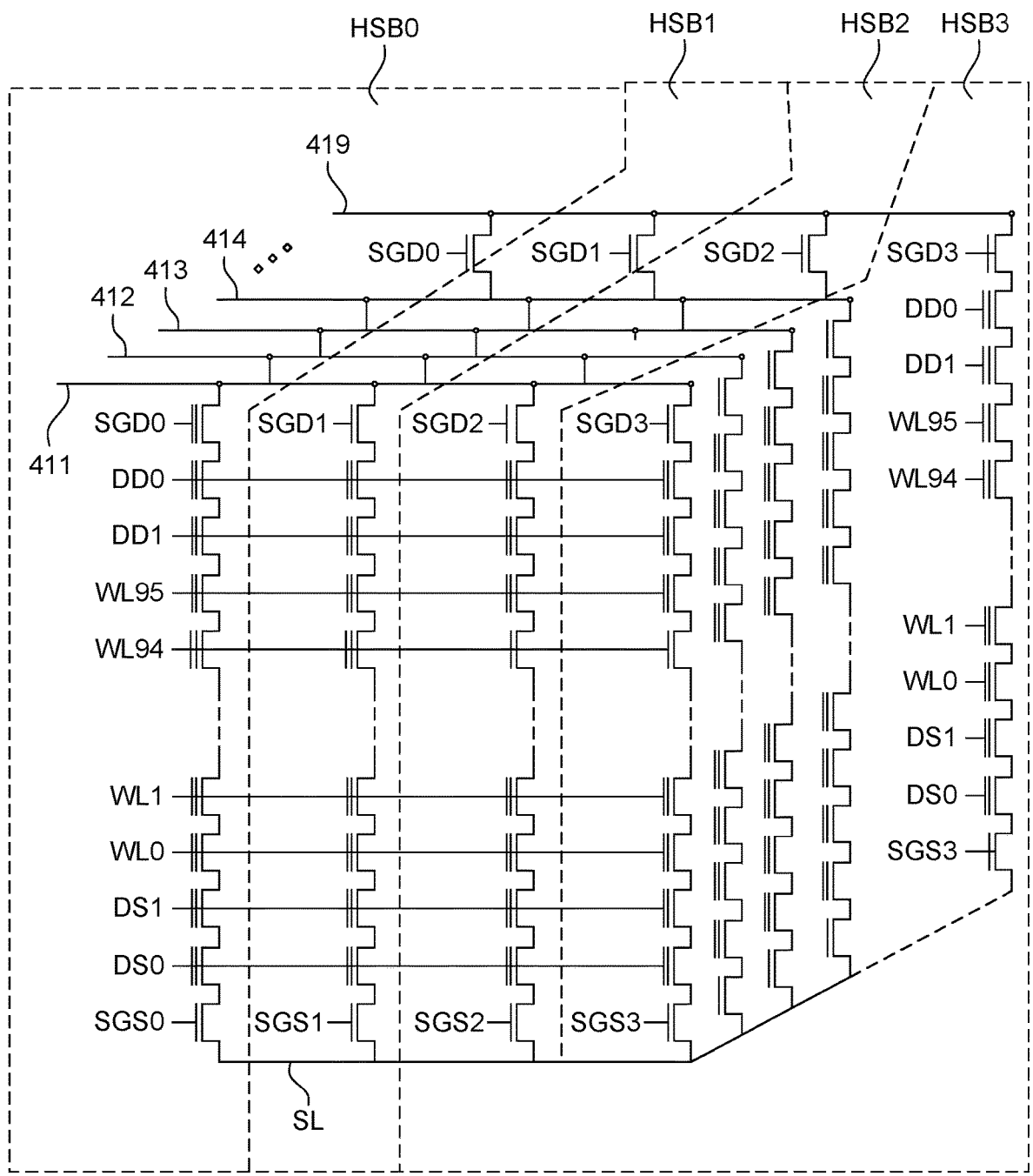
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
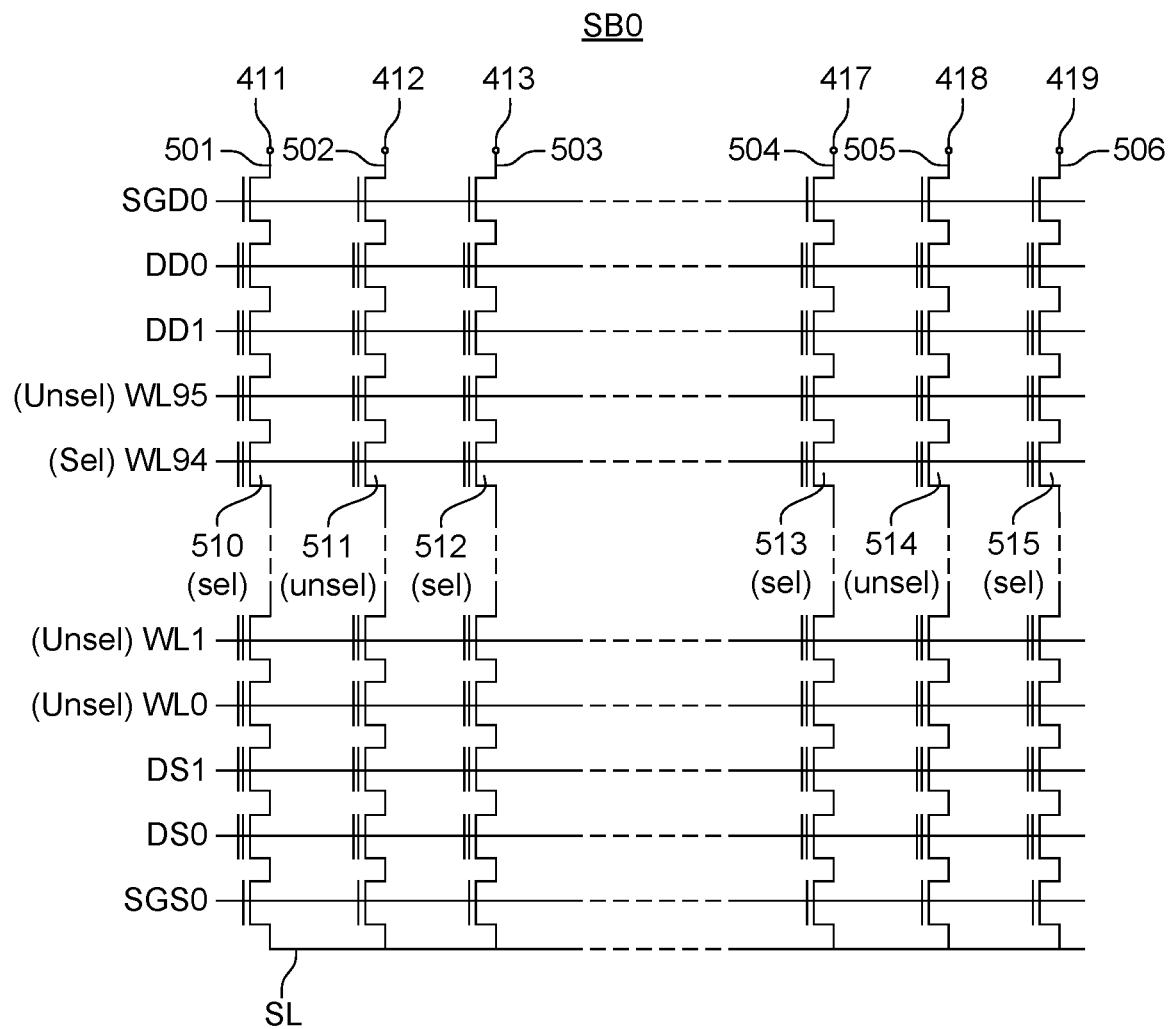
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 have similar structures. FIG. 4G shows physical wordlines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HS0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume for example purposes that memory cells 510, 512, 513 and 515 (which are connected to wordline WL94) are to be programmed to any of the data states S1-S7; therefore, memory cells 510, 512, 513 and 515 are selected memory cells (labeled sel in FIG. 4G).

Although the example memory system of FIGS. 3-4H is a three dimensional memory structure that includes vertical NAND strings with charge-trapping material, other (2D and 3D) memory structures can also be used with the technology described herein.

Figure 5:
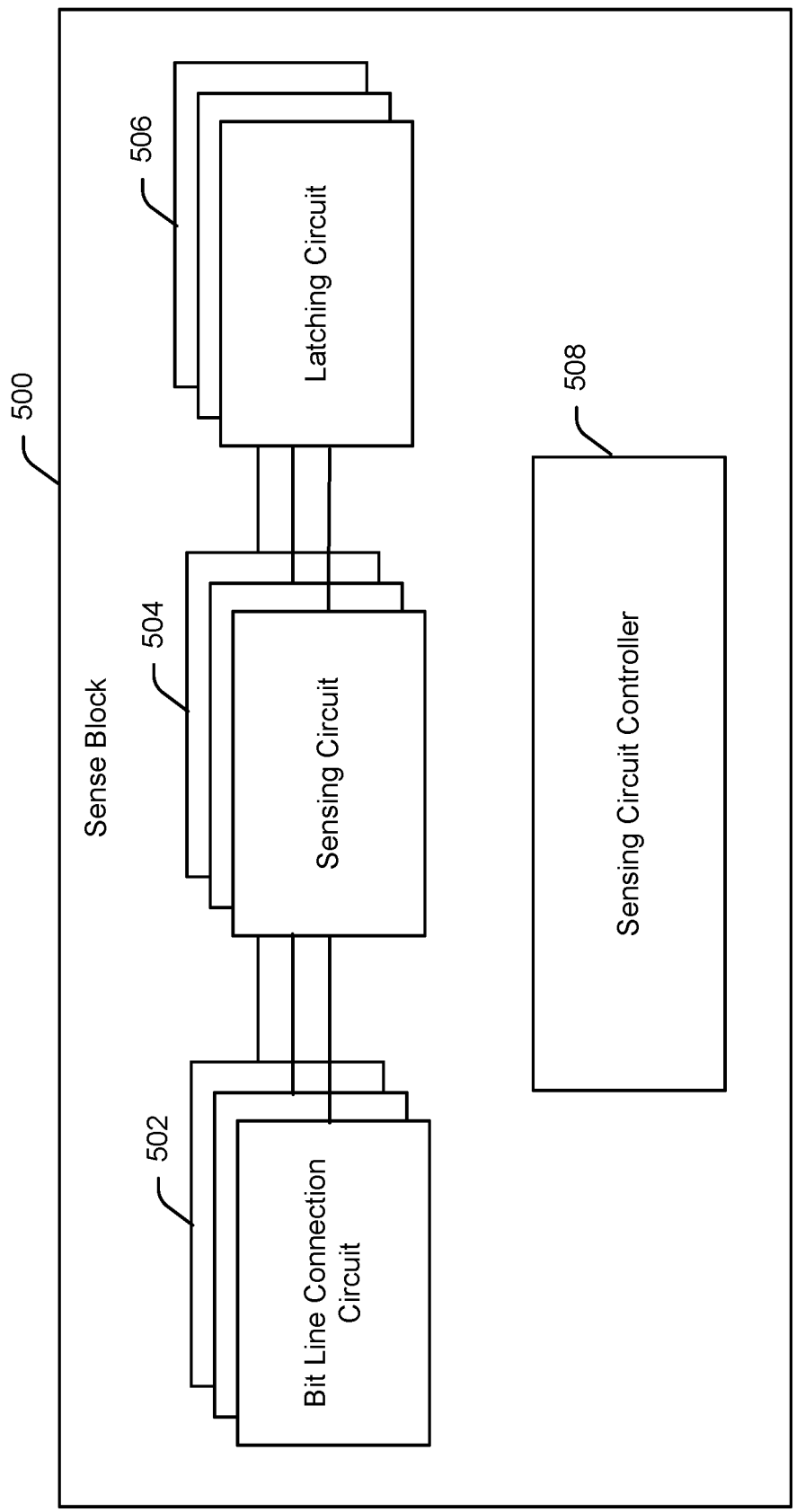
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150. The sense block 500 may include a plurality of sense circuits 504 and a plurality of sets of latching circuits 506. For example, there can be 16 k sets of sense circuits 504 and latching circuits 506. In other examples, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506.

The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of steps of any of the methods disclosed herein. The controller 508 may send messages and receive data, including program code, through one or more communication interface(s). The received code may be executed by a processor of the controller 508 as it is received, and/or stored in storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read and thus, for which a sense operation is performed. For a verification operation, a target memory cell can be a memory cell being programmed in an associated program-verify operation.

When the bitline connection circuitry connects the ith bitline BL(i) to the sensing circuit 504 (e.g. for a sense operation), current may flow from the sense circuit 504 to the ith bitline BL(i). Alternatively, when the bitline connection circuitry disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline (see above for distinction). In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
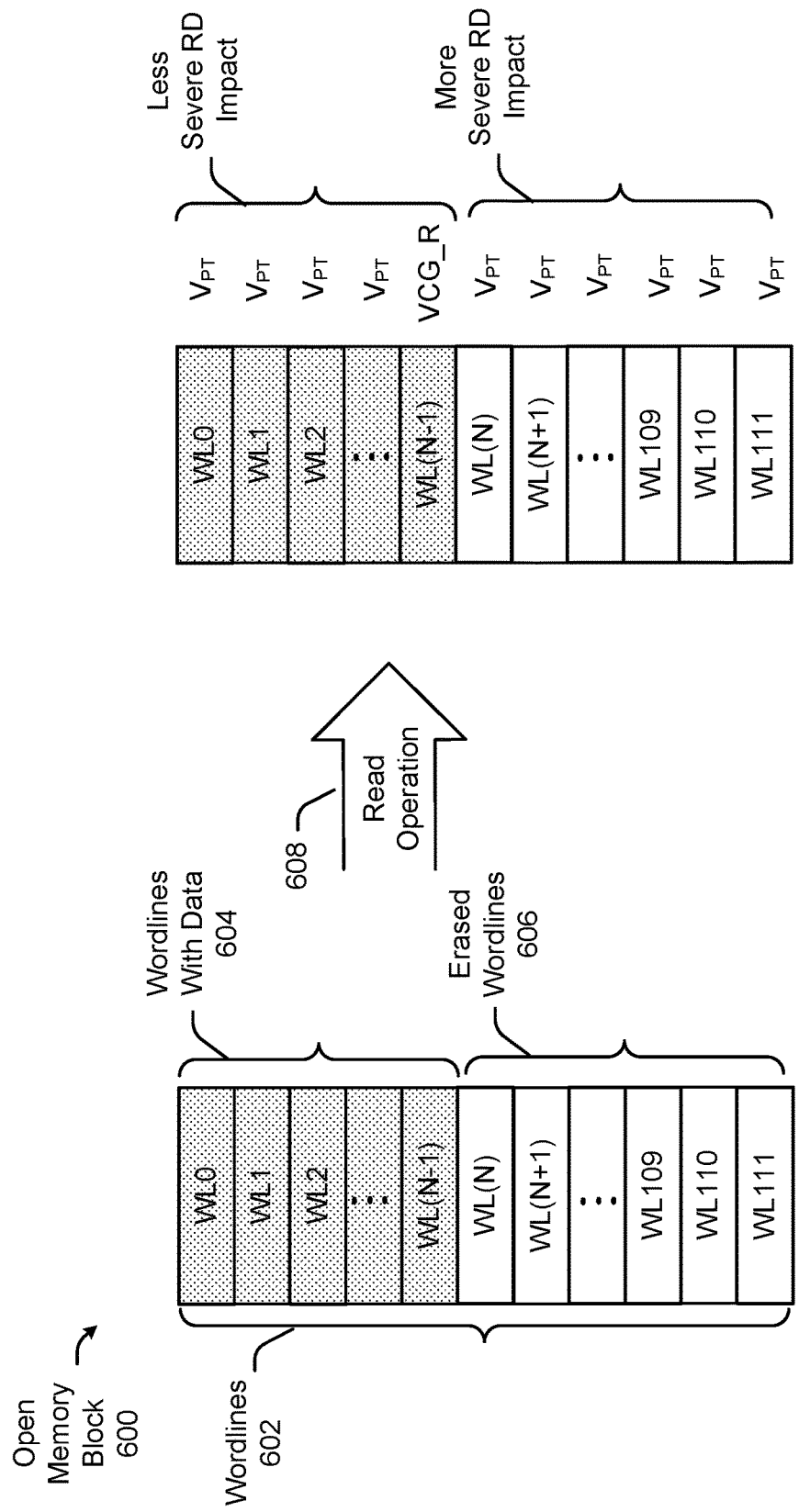
FIG. 6 schematically depicts a read disturb effect of a read operation performed on an open memory block.

FIG. 6 schematically depicts a read disturb effect of a read operation 608 performed on an open memory block 600. In some embodiments, the open memory block 600 may be a NAND memory block within a 3D NAND architecture. The NAND block 600 may include a plurality of NAND strings (e.g., 4 NAND strings), where each NAND string is comprised of a plurality of memory holes (e.g., 16K memory holes). Each memory hole with given a NAND string may be connected to a respective bitline (not shown in FIG. 6) that also connects to a respective corresponding memory hole in each other NAND string within the block 600 (as well as respective memory holes of other NAND strings of other NAND blocks (not shown in FIG. 6)).

Each memory hole of each NAND string of the memory block 600 may include a plurality of wordlines 602, which may be shared across all NAND strings/NAND blocks of the NAND structure containing the block 600. In the example implementation depicted in FIG. 6, the block 600 includes wordlines WL0 to WL111. Each wordline 602 may include a plurality of memory cells, where each cell may be in a programmed state (potentially one of multiple possible programmed states) or an erased state. A cell that is programmed with a threshold voltage corresponding to a programmed logical state may be referred to herein as being "filled with data," whereas a cell that has not been programmed and is in an erased state may be referred to herein as being "empty." It should be appreciated a wordline that is "filled with data" may nonetheless include one or more memory cells in the erased state. That is, in some embodiments, a wordline may be treated as being "filled with data" as long as at least one memory cell of the wordline has been programmed. The wordlines 604 that are filled with data are shown with shading, while the erased wordlines 606 are shown without shading. This convention is employed throughout the figures.

FIG. 6 depicts a read disturb impact of an example read operation 608. As shown a voltage VCG_R may be applied to the wordline (e.g., WLN−1) containing the memory cell to be read. Further, a pass-through voltage $V_{PT}$ may be applied to each other wordline. As noted earlier, the pass-through voltage $V_{PT}$ may be a voltage known to be higher than any threshold voltage that may be stored in any of the memory cells of the wordlines to which $V_{PT}$ is applied. However, the pass-through voltage $V_{PT}$ may still be lower than the programming voltage $V_{PGM}$. For instance, assume that the highest threshold voltage that can be stored in a transistor of a memory cell is 7V (e.g., the threshold voltage of the "G state"). Then, the pass-through voltage $V_{PT}$ may be 9V, while the programming voltage $V_{PGM}$ may be 15V, for example. Applying the pass-through voltage $V_{PT}$ to each wordline other than the one containing the cell being read ensures that a path is provided for the bit stored in the cell being read to propagate through a corresponding bitline to an output where it can be sensed by a sense block (e.g., sense block 500).

If the threshold voltage of the transistor of the cell (which may be referred to herein as the threshold voltage of the cell for shorthand) exceeds the applied voltage VCG_R, then the transistor is not switched ON (i.e., is non-conductive). The read memory cell may be determined to be non-conductive based, for example, on a sensing circuit 504 of a sense block 500 not sensing a current in a corresponding bitline. If the read memory cell is non-conductive, it may be determined to be storing a logic state 0. Conversely, if the applied voltage VCG_R exceeds the threshold voltage of the transistor of the cell being read, then the transistor is switched ON, and current is detected in a corresponding bitline. In this case, the cell may be determined to be in an erased state, which corresponds to a logic state 1. In some embodiments, when a cell is in the erased state, the erase upper tail/threshold voltage of the transistor of the cell may be about 0V, and in some cases, may be a negative voltage. Accordingly, the applied read reference voltage VCG_R may be a voltage that is about 0V, and in some cases, slightly larger than 0V (e.g., 0.1V).

As previously described, a read operation such as read operation 608 has a disproportionate read disturb impact on the erased wordlines 606 as compared to the wordlines 604 that contain data. This is because the difference between the pass-through voltage $V_{PT}$ and the threshold voltages of the memory cells in the erased wordlines 606 (which are in the erased state) is greatest, which increases the stress on these cells and makes them more susceptible to being soft-programmed than the cells in the wordlines 604 that contain data. Audit techniques according to embodiments of the disclosed technology for detecting read disturb in an open memory block will now be described in more detail in reference to FIGS. 7-10B. As noted earlier, audit techniques according to embodiments of the disclosed technology are able to accurately assess the level of read disturb specifically impacting erased wordlines (e.g., erased wordlines 606), and are applicable to even those scenarios in which only a single erased wordline is experiencing read disturb, and as such, provide a technical improvement over existing read disturb detection techniques.

Figure 7:
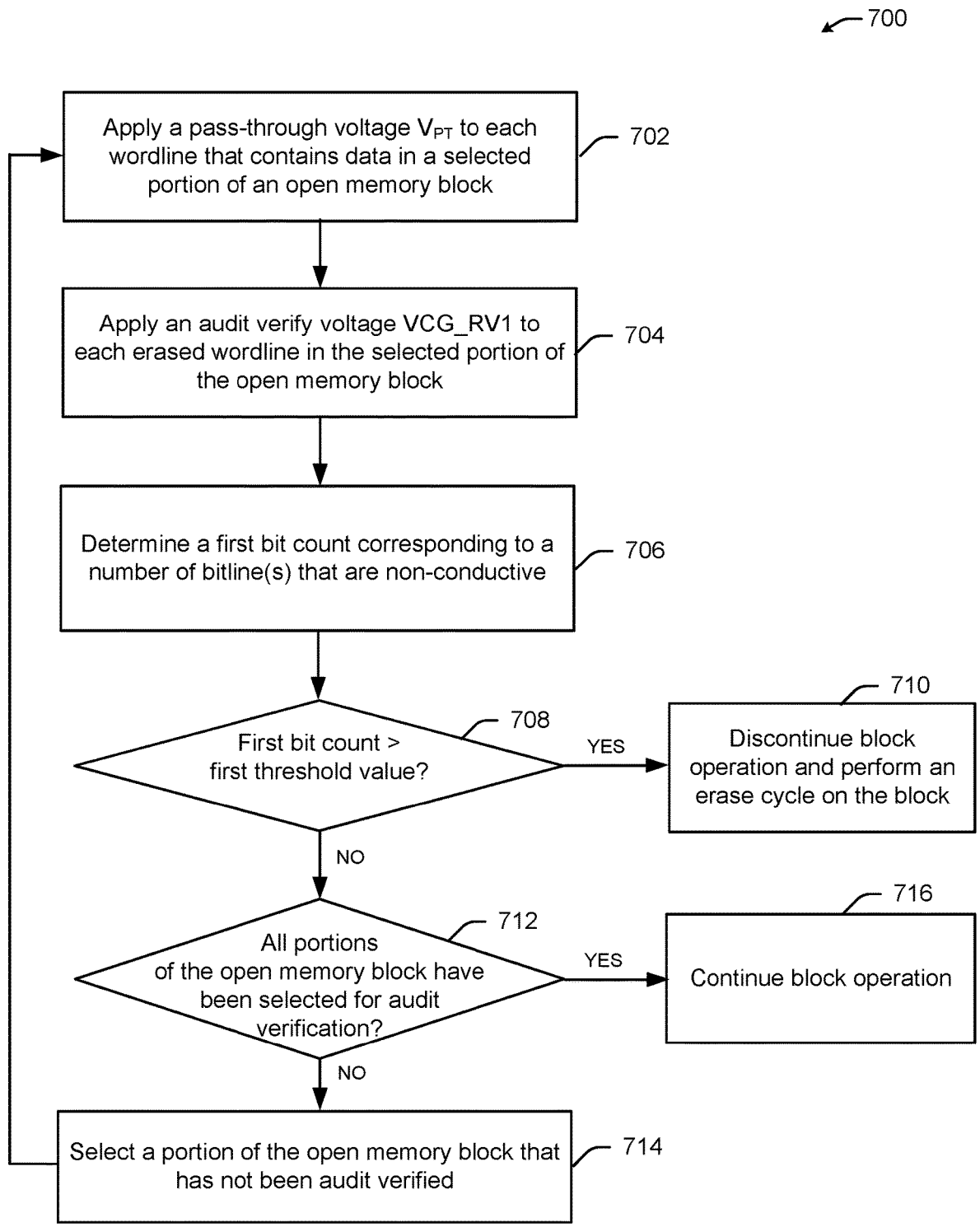
FIG. 7 is a flowchart depicting an audit verify method for determining a read disturb level of an open memory block and determining whether to continue operation of the open memory block based on the read disturb level, according to example embodiments of the disclosed technology.
Figure 9A:
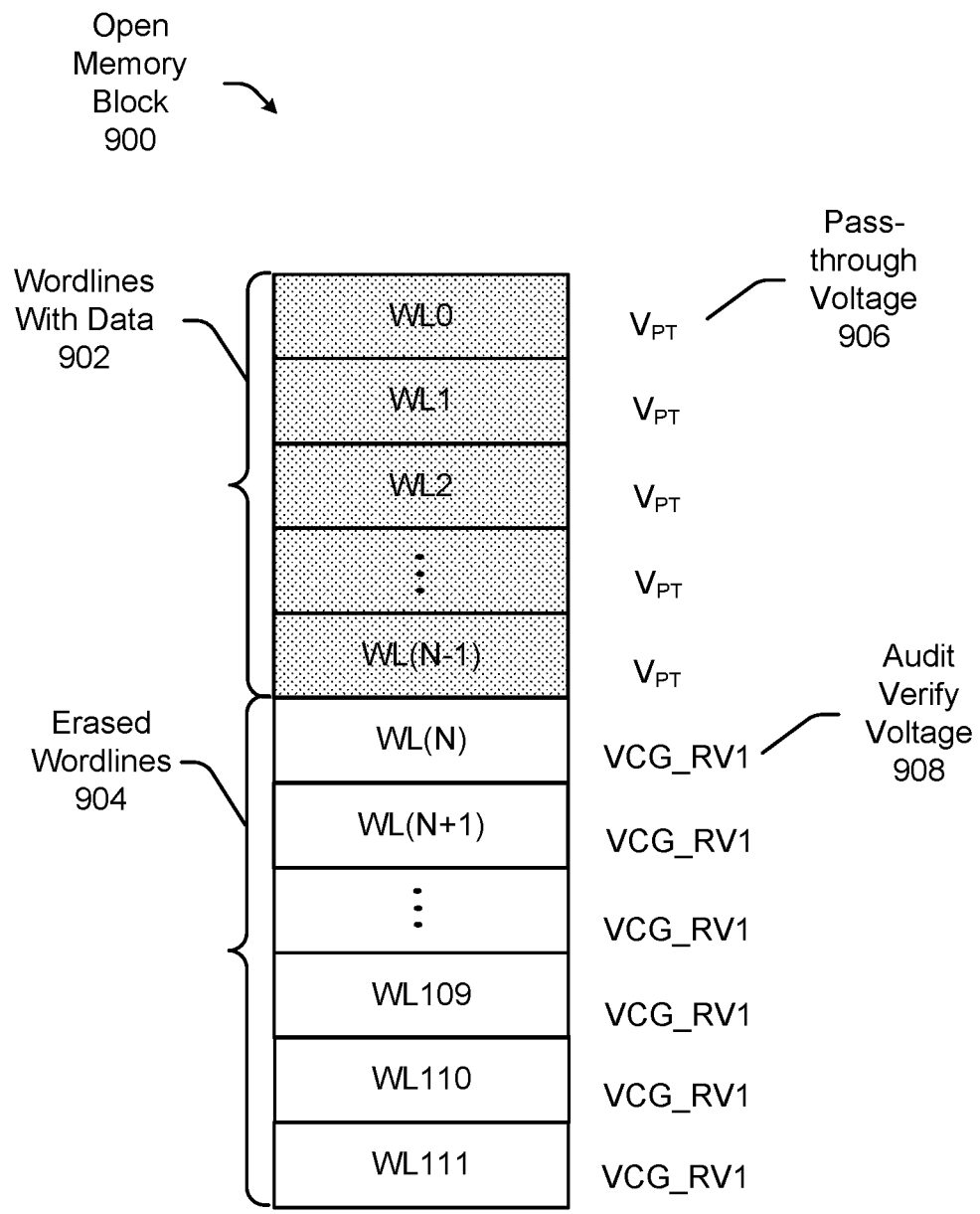
FIG. 9A schematically depicts the audit verify method according to example embodiments of the disclosed technology.

FIG. 7 depicts a flowchart of an audit verify method 700 for determining a read disturb level of an open memory block and determining whether to continue operation of the open memory block based on the read disturb level, according to example embodiments of the disclosed technology. The method 700 may be performed, for example, by controller 122. FIG. 9A schematically depicts the audit verify method 700 depicted in the flowchart of FIG. 7. Accordingly, FIGS. 7 and 9A will be described together hereinafter.

Referring now to FIG. 7, at step 702 of the audit verify method 700, a pass-through voltage $V_{PT}$ is applied to each wordline that contains data in a selected portion of an open memory block, such as a selected NAND string of a NAND block. In some embodiments, the pass-through voltage $V_{PT}$ is applied in parallel to each wordline that contains data. Referring to the open memory block 900 depicted in FIG. 9A, the pass-through voltage 906 is applied to wordlines 902 with data, which includes wordlines WL0-WL(N−1) in this example. As previously noted, in some embodiments, a wordline has data as along as least one memory cell of the wordline has been programmed.

At step 704 of the method 700, an audit verify voltage VCG_RV1 is applied to each erased wordline in the selected NAND string of the open memory block. In some embodiments, the audit verify voltage VCG_RV1 is applied to each erased wordline in parallel. Further, in some embodiments, the audit verify voltage VCG_RV1 is applied in parallel with the pass-through voltage $V_{PT}$. Referring again to the open memory block 900 depicted in FIG. 9A, the audit verify voltage 908 (i.e. voltage VCG_RV1) is applied to each erased wordline 904, which includes wordlines WL(N)-WL111 in this example. In some embodiments, the audit verify voltage 908 may be slightly larger than a threshold voltage of a memory cell that is in the erased state. In some embodiments, the audit verify voltage 908 may be slightly smaller than a threshold voltage associated with a programmed state of a memory cell, which may be the smallest threshold voltage associated with a programmed state in those cases in which a cell can be programmed with any of multiple different states. In this manner, the audit verify voltage 908 maintains a sensitivity to the threshold voltage shift that is indicative of read disturb.

At step 706 of the method 700, a first bit count may be determined. The first bit count may correspond to a number of one or more bitlines that are non-conductive. As previously noted, in some embodiments, a NAND memory block may include 4 NAND strings, each of which may include 16K memory holes. The 112 wordlines depicted, for example, as part of open memory block 900 in FIG. 9A may be shared across all memory holes of all NAND strings. As previously noted, a respective bitline may connect each memory hole in a NAND string of a NAND block to a respective corresponding memory hole in each other NAND string of the NAND block. Thus, if there are 16K memory holes in each NAND string, for example, then 16K bitlines may be provided. In some embodiments, while a given bitline may connect a single memory hole from a given NAND string of a NAND block with a single memory hole from each other NAND string in the NAND block (and for that matter may further connect to a single memory hole from each NAND string of each other NAND block within the 3D NAND structure), the audit verify method 700 may be performed on a per-string basis such that at each iteration of the method 700, a single NAND string of a given NAND block is selected, while other NAND strings in the same NAND block, as well as NAND strings of other NAND blocks, remain unselected. As such, in some embodiments, at each iteration of the method 700, the first bit count may be determined with respect to the memory cells of the wordlines that are contained in the memory holes of a particular selected NAND string, and may be a count of each bitline among the total number of bitlines (e.g., 16K bitlines) that is non-conductive. A bitline may be non-conductive due to one or more memory cells in the erased wordlines of the memory hole of the selected NAND string that is connected to that bitline having a threshold voltage (e.g., an erase upper tail) above the audit verify voltage VCG_RV1.

Referring in more detail to the example open memory block 900 depicted in FIG. 9A, the pass-through voltage $V_{PT}$ applied to each wordline 902 that contains data ensures that all of the transistors of the memory cells in these wordlines 902 are conductive. If any erased wordline 904 includes at least one memory cell having a transistor with a threshold voltage above the audit verify voltage 908, this would be detectable because that transistor would be non-conductive, and as such, no current would be sensed on a corresponding bitline. In some embodiments, if a transistor in a memory cell of an erased wordline 904 has a threshold voltage above the audit verify voltage 908, this may indicate that the transistor has experienced read disturb and has been soft-programmed such that the memory cell now stores a different logical state than the erased state. In this manner, the audit verify method 700 is able to generate a metric (e.g., the first bit count) that indicates a level to which read disturb has impacted the open memory block 900, and in particular, the erased wordlines 904 of the open memory block 900.

In some embodiments, even if only one memory cell of one of the erased wordlines 904 has experienced read disturb that has pushed the threshold voltage of its transistor above the audit verify voltage 908, the audit verify method 700 is able to detect this because that memory cell would be non-conductive, and the bitline connected to the memory hole that includes that memory cell would not see a current, and thus, would be accounted for in the first bit count. It should be appreciated, however, that while the first bit count tracks a number of bitline(s) that are non-conductive due to one or more connected memory cells of one or more erased wordlines having a threshold voltage above the audit verify voltage 908, and thus, would be incremented even if only a single wordline, or for that matter, only a single cell of a single wordline experiences read disturb, in some embodiments, the first bit count may not reflect the total number of individual memory cells or the total number of individual wordlines that have experienced read disturb. For instance, if multiple memory cells from different wordlines have experienced read disturb, but each of these cells is contained within a memory hole connected to the same bitline, then the first bit count may only be incremented by one based on the absence of current detected on the bitline, despite multiple cells being non-conductive.

At step 708 of the method 700, the first bit count may be compared to a first threshold value to determine whether to continue operation of the open memory block, or alternatively, discontinue its operation, transfer any existing data in the block to another memory block, and perform an erase cycle on the block to erase all wordlines of the block. In some embodiments, the first threshold value may be a value that reflects a desired level of tolerance of the system to read disturb. If there is low tolerance to read disturb, the first threshold value may be set relatively lower than if there is a higher tolerance to read disturb.

If it is determined at step 708 that the first bit count exceeds the first threshold value, thereby indicating, for example, that the level of read disturb among the erased wordlines 904 of the open memory block 900 exceeds an acceptable level, then the method 700 may proceed to step 710, where operation of the block 900 is discontinued, existing data stored in the block 900 (i.e., data stored in wordlines 902) is transferred to another memory block, and the block 900 is cycled to erase all wordlines of the block 900. As previously noted, in some embodiments, the method 700 may be performed on a per-NAND string basis, in which case, if the first bit count determined with respect to the currently selected NAND string exceeds the first threshold value, the entire open memory block 900 may be cycled without performing the audit verify method 700 on any additional NAND string of block 900 that remains to be verified, and thus, without assessing the read disturb impact on any such additional NAND string.

If, on the other hand, it is determined that the first bit count does not exceed the first threshold value, thereby indicating that the read disturb level of the selected NAND string of the block 900, or more specifically, the read disturb level of the erased wordlines 904 corresponding to the memory holes of the selected NAND string of the block 900, is within an acceptable tolerance, then the method 700 may proceed to step 712, where a determination is made as to whether all portions (e.g., NAND strings) in the open memory block 900 have been audit verified. In response to a positive determination at step 712, operation of the open memory block 900 is permitted to continue at step 716. On the other hand, in response to a negative determination at step 712, the method 700 may proceed to step 714, where a next NAND string in the open memory block 900 is selected. The method 700 may then be performed beginning at step 702 on the newly selected NAND string. Thus, in some embodiments, operation of the open memory block may continue at step 716 only if the respective first bit count determined for each NAND string in the open memory block is less than the first threshold value. In some embodiments, the audit verify method 700 may be triggered for an open memory block in response to a condition being satisfied, such as after every X number of read operations are performed on the block.

Figure 8:
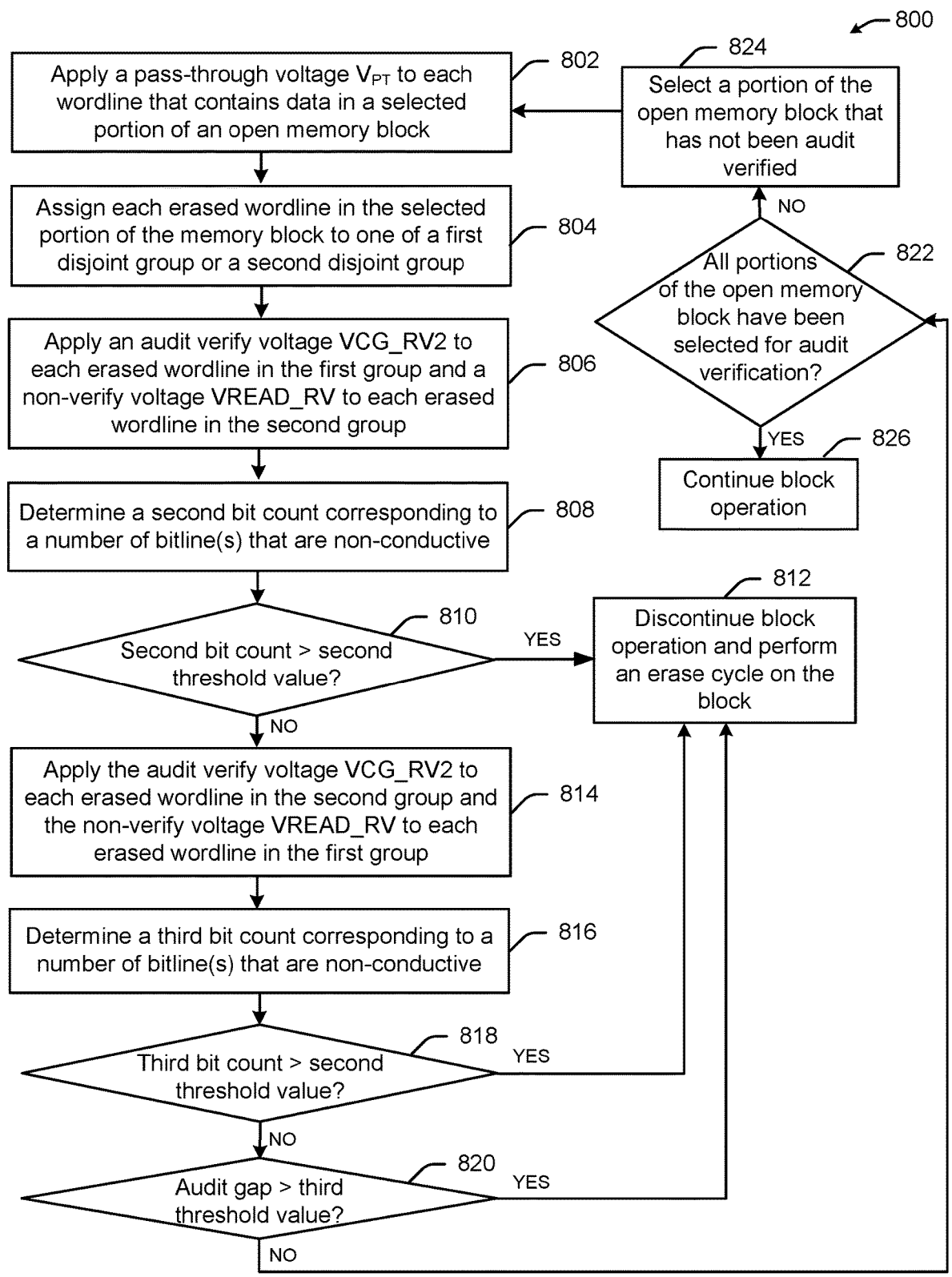
FIG. 8 is a flowchart depicting an audit verify and audit gap method for determining a read disturb level of an open memory block and determining whether to continue operation of the open memory block based on the read disturb level, according to example embodiments of the disclosed technology.

FIG. 8 is a flowchart depicting an alternative method 800 for performing read disturb detection in accordance with example embodiments of the disclosed technology. The audit verify and audit gap method 800 depicted in FIG. 8 will be described hereinafter together with FIG. 9B, which is a schematic depiction of the method 800 with respect to the example open memory block 900. The method 800 may be performed, for example, by controller 122. It should be appreciated that while "second" and "third" are used to identify the bit counts determined as part of method 800 and to distinguish them from the "first" bit count determined as part of method 700, the second and third bit counts of method 800 may alternatively be referred to, respectively, as first and second bit counts. The same may be true for the various threshold values described herein.

In some embodiments, electrons may become trapped between the memory cells of adjacent wordlines. When this occurs, even if the audit verify voltage 908 is sufficient to make a transistor of a memory cell that is in the erased state conductive—which would generally indicate that the cell has not experienced read disturb—it may be insufficient to make the area between the memory cells of adjacent wordlines conductive. As such, when this trapped electron phenomenon occurs, a bitline may not receive a current even though no read disturb has occurred for any of the cells connected to the bitline. Thus, in those scenarios in which electrons become trapped between cells of adjacent wordlines, VCG_RV1 may be inadequate for distinguishing between memory cells in erased wordlines that have experienced read disturb and those that have not.

Referring now to FIG. 8, at step 802 of the audit verify and audit gap method 800, a pass-through voltage $V_{PT}$ is applied to each wordline that contains data in a selected portion of an open memory block, such as a selected NAND string of an open NAND block. Referring to the open memory block 900 depicted in FIG. 9B, the pass-through voltage 906 is applied to wordlines 902 with data, including wordlines WL0-WL(N−1), similar to the operation at block 702 of method 700. The pass-through voltage 906 may be sufficient to make all cells in the wordlines 902 conductive as well as the channels between cells of adjacent wordlines, which may include trapped electrons.

Figure 9B:
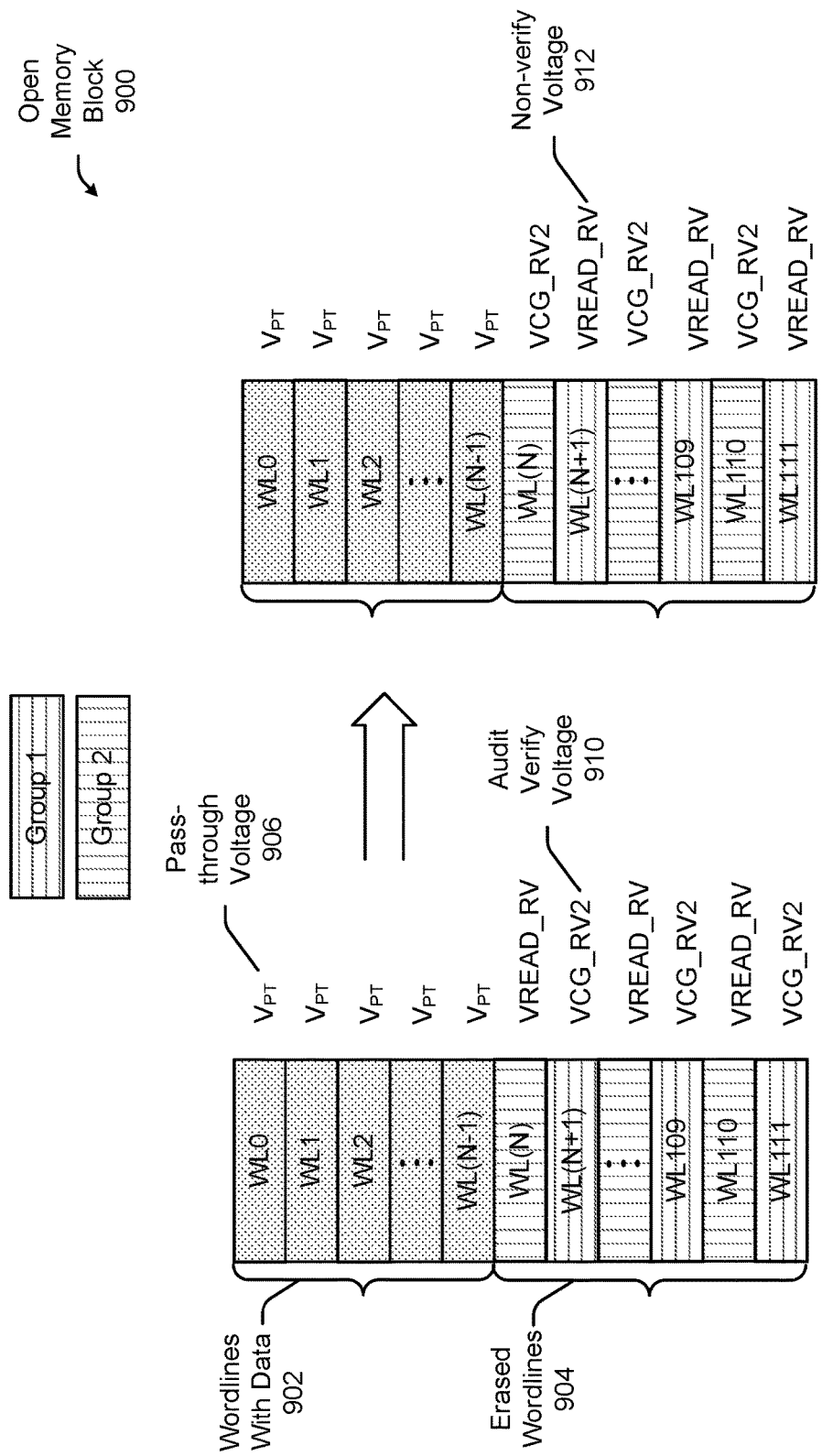
FIG. 9B schematically depicts the audit verify and audit gap method according to example embodiments of the disclosed technology.

At step 804 of the method 800, each erased wordline in the open memory block is assigned to one of a first group or a second group, where the first and second groups are disjoint groups. Referring again to the example of FIG. 9B, each of the erased wordlines 904 of the open memory block 900 may be assigned to one of a first group or a second group. In FIG. 9B, erased wordlines assigned to the first group are depicted with horizontal lines and erased wordlines assigned to the second group are depicted with vertical lines. In some embodiments, the erased wordlines 904 may be alternatively assigned in succession—beginning with the first erased wordline WL(N)—to the first group and the second group. For instance, the first erased wordline WL(N) may be assigned to the second group, the next wordline WL(N+1) may be assigned to the first group, the next wordline after that WL(N+2) may be assigned to the second group, and so forth until reaching the final erased wordline WL111 in the open memory block 900. Alternatively, the first erased wordline WL(N) may be assigned to the first group, the next wordline WL(N+1) may be assigned to the second group, and the assignment of the remaining erased wordlines 904 may proceed similarly by alternating between the first group and the second group when assigning each successive erased wordline 904. It should be appreciated that other assignment schemes are contemplated as well. For instance, multiple erased wordlines may be assigned together to one of the first group or the second group during each iteration of an assignment scheme. For example, the first three erased wordlines WL(N), WL(N+1), and WL(N+2) may be assigned to the first group, the next three to the second group, the next three after that to the first group, and so forth.

At step 806 of the method 800, an audit verify voltage VCG_RV2 may be applied to each erased wordline in the first group and a non-verify voltage VREAD_RV2 may be applied to each erased wordline in the second group. Referring again to the open memory block 900 depicted in FIG. 9B, an audit verify voltage 910 (i.e. voltage VCG_RV2) is applied to each erased wordline 904 assigned to the first group, which includes wordlines WL(N+1), WL(N+3), and so forth, in this example. Further, a non-verify voltage 912 (i.e., VREAD_RV2) is applied to each wordline 904 assigned to the second group, which includes wordlines WL(N), WL(N+2), and so forth, in this example. In some embodiments, the audit verify voltage 910 may be slightly larger than a threshold voltage of a memory cell that is in the erased state and slightly smaller than a threshold voltage associated with a programmed state of a memory cell, which may be, for example, the smallest threshold voltage associated with a programmed state in those cases in which a cell can be programmed with any of multiple different states.

Moreover, in some embodiments, the audit verify voltage 910 (i.e., VCG_RV2) may be slightly higher than the audit verify voltage 908 (i.e., VCG_RV1) applied in the method 700. This may be the case because the memory environment differs between the two scenarios—the scenario in which the method 700 is performed and the scenario in which the method 800 is performed. In particular, because the higher non-verify voltage 912 is applied to wordlines that are adjacent to the wordlines to which the audit verify voltage 910 is applied, the audit verify voltage 910 may be made lower than the audit verify voltage 908 in some embodiments. Further, the non-verify voltage 912 may be made large enough to ensure not only that the cells of the wordlines in the second group to which it is applied are conductive, but also that the area between adjacent cells belonging to different wordlines becomes conductive. While being large enough to ensure that the area between adjacent cells—which may include trapped electrons—becomes conductive, the non-verify voltage 912 may be smaller than the pass-through voltage 906 to eliminate, or at the least mitigate, the likelihood of soft-programming the cells to which it is applied.

At step 808 of the method 800, a second bit count may be determined. The second bit count may be determined with respect to the memory cells of the wordlines that are contained in the memory holes of a particular selected NAND string, and may be a count of each bitline among the total number of bitlines (e.g., 16K bitlines) that is non-conductive. A bitline may be non-conductive due to one or more memory cells in the erased wordline(s) to which the audit verify voltage VCG_RV2 is applied (i.e., the wordlines in the first group) having a threshold voltage (e.g., an erase upper tail) above VCG_RV2.

Referring again to the example open memory block 900 depicted in FIG. 9B, the pass-through voltage 906 applied to each wordline 902 that contains data ensures that all of the transistors of the memory cells in these wordlines 902 are conductive. Further, the non-verify voltage 912 applied to wordlines in the second group ensures that both the memory cells in these wordlines are conductive and the areas between cells—which may contain trapped electrons—are also conductive. Then, any erased wordline 904 in the first group that includes at least one memory cell having a transistor with a threshold voltage above the audit verify voltage 908 is identifiable because that transistor would be non-conductive, and as such, no current would be sensed in the bitline connected to the wordline that includes that cell. In some embodiments, if a transistor in a memory cell of an erased wordline 904 has a threshold voltage above the audit verify voltage 908, this may indicate that the transistor has experienced read disturb and has been soft-programmed such that the memory cell now stores a different logical state than the erased state. In this manner, the audit verify and audit gap method 800 is able to generate a metric (e.g., the second bit count) that indicates—even when trapped electrons are present between cells—a level to which read disturb has impacted the open memory block 900, and in particular, the erased wordlines 904 of the open memory block 900.

At step 810 of the method 800, the second bit count may be compared to a second threshold value to determine whether to proceed with audit verification of any unselected portion(s) (e.g., NAND string(s)) the open memory block, or alternatively, discontinue operation of the open memory block, transfer any existing data in the block to another memory block, and perform an erase cycle on the block to erase all wordlines of the block. In some embodiments, the second threshold value may be a value that reflects a desired level of tolerance of the system to read disturb. If there is low tolerance to read disturb, the second threshold value may be set relatively lower than if there is a higher tolerance to read disturb.

If it is determined at step 810 that the second bit count exceeds the second threshold value, thereby indicating, for example, that the level of read disturb among the erased wordlines 904 of the selected NAND string of the open memory block 900 exceeds an acceptable level, then the method 800 may proceed to block 812, where operation of the block 900 is discontinued, existing data stored in the block 900 (i.e., data stored in wordlines 902) is transferred to another memory block, and the block 900 is cycled to erase all wordlines of the block 900. If, on the other hand, it is determined that the second bit count does not exceed the second threshold value, thereby indicating that the read disturb level of the erased wordlines 904 in the first group is within an acceptable tolerance for the currently selected NAND string, then the method 800 may proceed to step 814. In some embodiments, steps 802 and 804 may constitute at least part of a preliminary stage of the method 800, steps 806, 808, and 810 may constitute at least part of a first audit verify stage of the method 800, steps 814, 816, and 818 may constitute at least part of a second audit verify stage of the method 800, and step 820 may constitute at least part of a third audit verify stage of the method 800.

At step 814 of the method 800, the audit verify voltage VCG_RV2 may be applied to each erased wordline in the second group and the non-verify voltage VREAD_RV2 may be applied to each erased wordline in the first group. The pass-through voltage $V_{PT}$ may continue to be applied to each wordline that contains data. Referring again to the open memory block 900 depicted in FIG. 9B, at this stage in the method 800, the audit verify voltage 910 (i.e. voltage VCG_RV2) is applied to each erased wordline 904 assigned to the second group, which includes wordlines WL(N), WL(N+2), and so forth, in this example. Further, the non-verify voltage 912 (i.e., VREAD_RV2) is applied to each wordline 904 assigned to the first group, which includes wordlines WL(N+1), WL(N+3), and so forth, in this example. As described earlier, in some embodiments, the audit verify voltage 910 may be slightly larger than a threshold voltage of a memory cell that is in the erased state and slightly smaller than a threshold voltage associated with a programmed state of a memory cell, which may be, for example, the smallest threshold voltage associated with a programmed state. Further, the non-verify voltage 912 may be made large enough to ensure that not only the cells of the wordlines in the second group to which it is applied are conductive, but also that the area between adjacent cells belonging to different wordlines becomes conductive. Further, the audit verify voltage 910 (i.e., VCG_RV2) may be slightly higher than the audit verify voltage 908 (i.e., VCG_RV1) applied in the method 700.

At step 816 of the method 800, a third bit count may be determined. The third bit count may be determined with respect to the memory cells of the wordlines that are contained in the memory holes of a particular selected NAND string, and may be a count of each bitline among the total number of bitlines (e.g., 16K bitlines) that is conductive. A bitline may be non-conductive due to one or more memory cells in the erased wordline(s) to which the audit verify voltage VCG_RV2 is applied (i.e., the wordlines in the second group) having a threshold voltage (e.g., an erase upper tail) above VCG_RV2.

Referring again to the example open memory block 900 depicted in FIG. 9B, the pass-through voltage $V_{PT}$ applied to each wordline 902 that contains data ensures that all of the transistors of the memory cells in these wordlines 902 are conductive. Further, the non-verify voltage 912 applied to wordlines in the first group ensures that both the memory cells in these wordlines are conductive and that the areas between cells—which may contain trapped electrons—are also conductive. Then, any erased wordline 904 in the second group that includes at least one memory cell having a transistor with a threshold voltage above the audit verify voltage 908 is identifiable because that transistor would be non-conductive, and as such, no current would be sensed in the bitline connected to that wordline. In some embodiments, if a transistor in a memory cell of an erased wordline 904 has a threshold voltage above the audit verify voltage 908, this may indicate that the transistor has experienced read disturb and has been soft-programmed such that the memory cell now stores a different logical state than the erased state.

At step 818 of the method 800, the third bit count may be compared to the second threshold value to determine whether to proceed with audit verification of the open memory block, or alternatively, discontinue its operation, transfer any existing data in the block to another memory block, and perform an erase cycle on the block to erase all wordlines of the block. If it is determined at step 818 that the third bit count exceeds the second threshold value, thereby indicating, for example, that the level of read disturb among the erased wordlines 904 in the second group of the selected NAND string of the open memory block 900 exceeds an acceptable level, then the method 800 may proceed to step 812, where operation of the block 900 is discontinued, existing data stored in the block 900 (i.e., data stored in wordlines 902) is transferred to another memory block, and the block 900 is cycled to erase all wordlines of the block 900. If, on the other hand, it is determined that the third bit count does not exceed the second threshold value, thereby indicating that the read disturb level of the erased wordlines in the second group of the selected NAND string is within an acceptable tolerance, then the method 800 may proceed to step 820. Thus, in some embodiments, as the method 800 is performed on a per-NAND string basis, if the second bit count or the third bit count, each of which is determined with respect to the currently selected NAND string, exceeds the second threshold value, the entire open memory block 900 may be cycled without performing the audit verify method 800 on any additional NAND string of block 900 that remains to be verified, and thus, without assessing the read disturb impact on any such additional NAND string.

It should be appreciated that, in some embodiments, during the first verify stage of the method 800, the audit verify voltage VCG_RV2 may be applied to each wordline in the first group in parallel. Further, the non-verify voltage VREAD_RV may similarly be applied in parallel to each wordline in the second group. The same may be true for the second verify stage. That is, during the second verify stage of the method 800, the audit verify voltage VCG_RV2 may be applied to each wordline in the second group in parallel, and the non-verify voltage VREAD_RV may similarly be applied in parallel to each wordline in the first group. Moreover, in some embodiments, the audit verify voltage VCG_RV2 and the non-verify voltage VREAD_RV may be applied to respective erased wordlines in parallel with one another, and also in parallel with application of the pass-through voltage $V_{PT}$ to each wordline that contains data.

At step 820, an audit gap may be determined and compared to a third threshold value to determine whether to continue the method 800 for other unselected NAND string(s) in the open memory block, continue block operation (in the event that all NAND strings of the open memory block have passed audit verification), or perform an erase cycle on the open memory block. In some embodiments, the audit gap is defined as the difference between the second bit count and the third bit count. In some embodiments, for the memory cells in any given wordline that have erase upper tails that do not exceed the audit verify voltage 910, these erase upper tails may cancel each other out when calculating the audit gap, thereby leaving only those erase upper tails that exceed the audit verify voltage 910. The third threshold value may be configurable based on the desired sensitivity to read disturb.

In particular, in some embodiments, there may be a scenario in which only a single erased wordline has experienced read disturb. That is, only one or more memory cells in a single wordline may have experienced read disturb. It may further be the case that a memory cell that experienced read disturb in that single wordline is only weakly non-conductive upon application of VCG_RV2. In this example scenario, the application of the higher voltage VREAD_RV to adjacent wordlines may cause the cell that would otherwise be weakly non-conductive to, in fact, become conductive, in which case, the checks at steps 810 and 818 may pass even though read disturb is present in that single wordline. Determining the audit gap between the second bit count and the third bit count thus provides a mechanism for detecting read disturb in these example scenarios in which a memory cell in a single wordline is experiencing weak read disturb.

More specifically, in some embodiments, the notion of the audit gap is introduced in the audit verify and audit gap method 800 to address the potential difficulty in capturing a single wordline-level high erase upper tail due to application of the audit verify voltage VCG_RV2 to one group of erased wordlines and application of the larger voltage VREAD_RV to another group of erased wordlines. Assume, for example, that only one wordline in the first group (e.g., WL5) includes an erased cell having a threshold voltage higher than the VCG_RV. Under method 800, the open memory block 900 may still pass the audit process, that is, the erased cell may nonetheless be conductive because the higher voltage VREAD_RV is applied to the neighboring two wordlines (e.g., WL4 and WL6), which could impact the erased cell in WL5 and make it weakly conductive. Therefore, in order to capture a single wordline-level read disturb impact, the audit gap metric—defined as the difference between the second bit count and third bit count—is introduced. Assume, for example, that the second threshold value is 30, the second bit count is 25, and the third bit count is 20. Thus, both the second bit count and the third bit count are smaller than the second threshold value and would individually pass audit verification. Their difference (i.e., 5), however, may be larger than the third threshold value, which may be, for example, 4. This may then suggest that a single wordline in the first group disproportionately contributes to the second bit count, thus serving as a basis for cycling the block.

If the audit gap is determined to be greater than the third threshold value at step 820, then the method 800 may proceed to step 812 and operation of the block 900 may be discontinued and the block may be cycled. On the other hand, if the audit gap is below the third threshold value, the method 800 may proceed to step 822, where a determination is made as to whether all portions (e.g., NAND strings) in the open memory block 900 have been verified. In response to a positive determination at step 822, operation of the open memory block 900 is permitted to continue at step 826. On the other hand, in response to a negative determination at step 822, the method 800 may proceed to step 824, where a next NAND string in the open memory block 900 is selected. The method 800 may then be performed beginning at step 802 on the newly selected NAND string. Thus, in some embodiments, operation of the open memory block may continue at step 826 only if the audit verify and audit gap method 800 is satisfied for each NAND string in the open memory block. In some embodiments, the audit verify method 800 may be triggered for an open memory block in response to a condition being satisfied, such as after every X number of read operations are performed on the block.

Figure 10A:
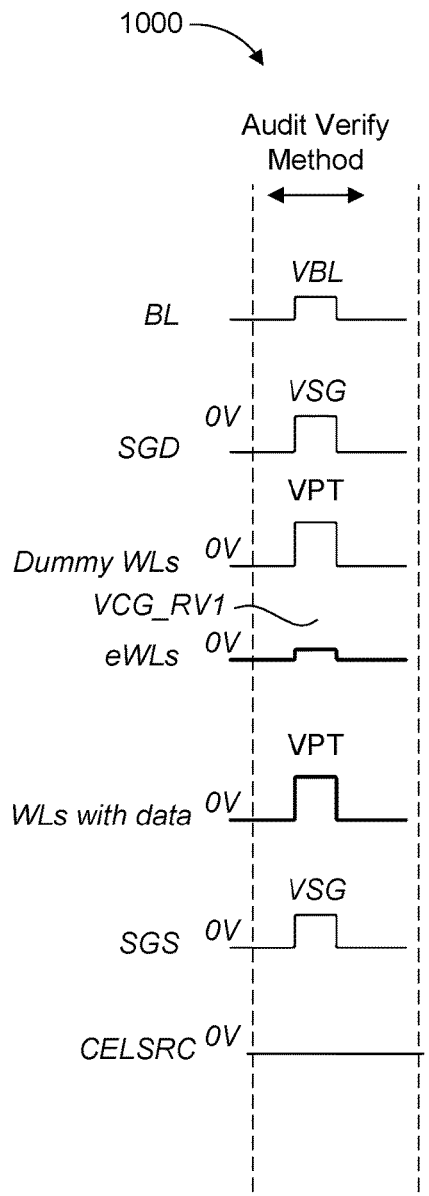
FIG. 10A schematically depicts various voltage signals associated with the audit verify method according to example embodiments of the disclosed technology.
Figure 10B:
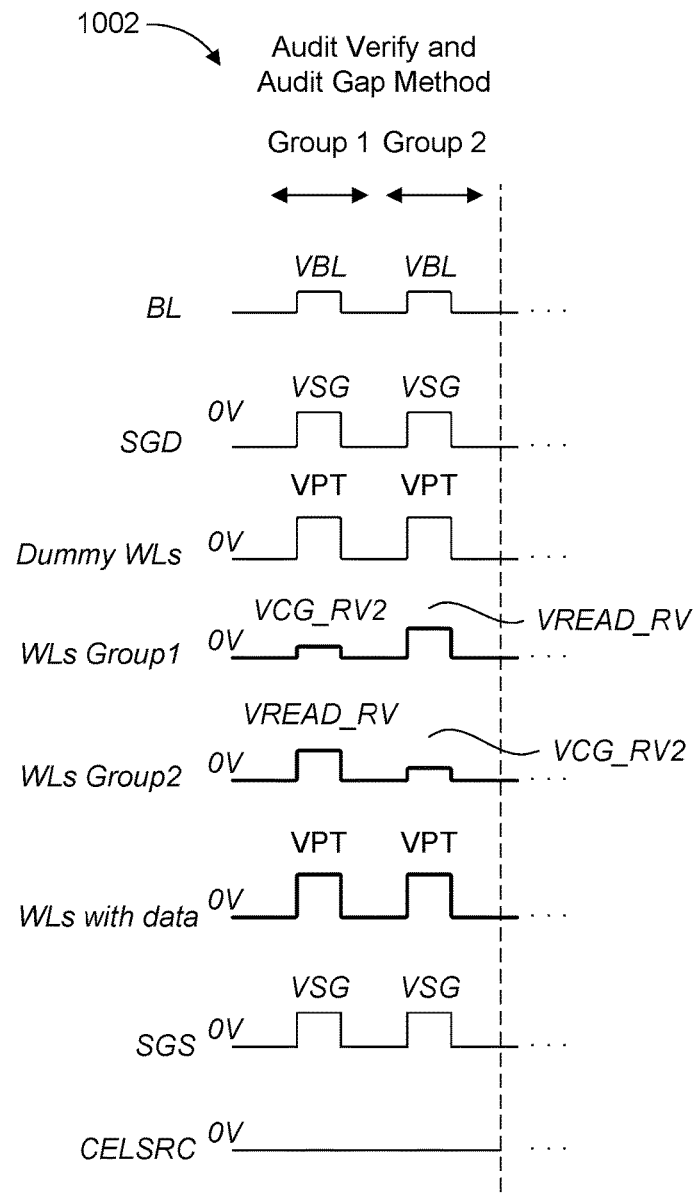
FIG. 10B schematically depicts various voltage signals associated with the audit verify and audit gap method according to example embodiments of the disclosed technology.

FIG. 10A schematically depicts various voltage signals associated with the audit verify method 700 and FIG. 10B schematically depicts various voltage signals associated with the audit verify and audit gap method 800. As shown, the pass-through voltage $V_{PT}$ is applied to dummy wordlines and wordlines containing data in both the method 700 and the method 800. Further, in the method 800, the pass-through voltage $V_{PT}$ is applied to the dummy wordlines and the wordlines containing data as part of the group 1 verify stage of the method 800 and the group 2 verify stage of the method 800. Moreover, as shown, the non-verify voltage VREAD_RV applied to alternating wordlines not being verified in a current verify stage is larger than the audit verify voltage VCG_RV2 that is applied to the wordlines that are being verified in the current verify stage. Further, as shown, audit verify voltage VCG_RV2 applied in the method 800 may be slightly smaller than the audit verify voltage VCG_RV1 applied in the method 700.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method for detecting read disturb in an open memory block comprising one or more wordlines containing data and one or more erased wordlines, the method comprising:
    applying a pass-through voltage to each wordline that contains data in the open memory block;
    applying an audit verify voltage to each erased wordline in the open memory block;
    determining a bit count indicative of a read disturb level of the one or more erased wordlines;
    determining whether the bit count exceeds a threshold value; and
    determining whether to continue operation of the open memory block based at least in part on whether the bit count exceeds the threshold value.

2. The method of claim 1, wherein determining the bit count comprises determining a number of bitlines that are non-conductive upon application of the audit verify voltage.

3. The method of claim 2, wherein each bitline that is non-conductive is connected to at least one erased wordline comprising one or more memory cells having respective threshold voltages above the audit verify voltage.

4. The method of claim 2, wherein each bitline that is non-conductive is connected to at least one erased wordline comprising one or more memory cells having respective erase upper tails above the audit verify voltage.

5. The method of claim 1, further comprising:
    determining that a read disturb detection condition has occurred, the read disturb detection condition comprising a threshold number of read cycles having been performed on the open memory block.

6. The method of claim 1, wherein the audit verify voltage is less than the pass-through voltage.

7. The method of claim 1, wherein the audit verify voltage is above a threshold voltage corresponding to an erased state of a memory cell and below a threshold voltage corresponding to a programmed state of the memory cell.

8. The method of claim 7, wherein the threshold voltage corresponding to the programmed state is a smallest threshold voltage among a set of threshold voltages that respectively correspond to a set of programmed states.

9. The method of claim 1, wherein it is determined that the bit count exceeds the threshold value, the method further comprising:
    discontinuing operation of the open memory block;
    transferring data contained in the open memory block to one or more other memory blocks; and
    performing an erase cycle on each wordline of the open memory block.

10. A memory system, comprising:
    a plurality of memory blocks including an open memory block comprising one or more wordlines containing data and one or more erased wordlines; and
    a memory controller, wherein the memory controller is configured to:
        apply a pass-through voltage to each wordline that contains data in the open memory;
        apply an audit verify voltage to each erased wordline in the open memory block;
        determine a bit count indicative of a read disturb level of the one or more erased wordlines;
        determine whether the bit count exceeds a threshold value; and
        determine whether to continue operation of the open memory block based at least in part on whether the bit count exceeds the threshold value.

11. The memory system of claim 10, wherein the memory controller is configured to determine the bit count by determining a number of bitlines that are non-conductive upon application of the audit verify voltage.

12. The memory system of claim 11, wherein each bitline that is non-conductive is connected to at least one erased wordline comprising one or more memory cells having respective threshold voltages above the audit verify voltage.

13. The memory system of claim 11, wherein each bitline that is non-conductive is connected to at least one erased wordline comprising one or more memory cells having respective erase upper tails above the audit verify voltage.

14. The memory system of claim 10, wherein the memory controller is further configured to:
  determine that a read disturb detection condition has occurred, the read disturb detection condition comprising a threshold number of read cycles having been performed on the open memory block.

15. The memory system of claim 10, wherein the audit verify voltage is less than the pass-through voltage.

16. The memory system of claim 10, wherein the audit verify voltage is above a threshold voltage corresponding to an erased state of a memory cell and below a threshold voltage corresponding to a programmed state of the memory cell.

17. The memory system of claim 16, wherein the threshold voltage corresponding to the programmed state is a smallest threshold voltage among a set of threshold voltages that respectively correspond to a set of programmed states.

18. A method for detecting read disturb in an open memory block comprising one or more wordlines containing data and a plurality of erased wordlines, the method comprising:
  applying a pass-through voltage to each wordline that contains data in the open memory block;
  dividing the plurality of erased wordlines into a first group of one or more erased wordlines and a second group of one or more erased wordlines;
  performing a first audit verify stage comprising:
    applying an audit verify voltage to each erased wordline in the first group;
    applying a non-verify voltage to each erased wordline in the second group
    determining a first bit count indicative of a read disturb level of the erased wordlines in the first group;
    determining whether the first bit count exceeds a first threshold value; and
    determining whether to continue operation of the open memory block or proceed to a second audit verify stage based at least in part on whether the first bit count exceeds the first threshold value.

19. The method of claim 18, wherein it is determined that the first bit count does not exceed the first threshold value, the method further comprising:
  performing the second audit verify stage comprising:
    applying the audit verify voltage to each erased wordline in the second group;
    applying the non-verify voltage to each erased wordline in the first group
    determining a second bit count indicative of a read disturb level of the erased wordlines in the second group;
    determining whether the second bit count exceeds the first threshold value; and
    determining whether to continue operation of the open memory block or proceed to a third audit verify stage based at least in part on whether the second bit count exceeds the first threshold value.

20. The method of claim 19, wherein it is determined that the second bit count does not exceed the first threshold value, the method further comprising:
  determining an audit gap between the first bit count and the second bit count;
  determining whether the audit gap exceeds a second threshold value; and
  determining whether to continue operation of the open memory block or perform an erase cycle on the open memory block based at least in part on whether the audit gap exceeds the second threshold value.

* * * * *